(12) United States Patent
Song et al.

(10) Patent No.: US 10,763,401 B2
(45) Date of Patent: Sep. 1, 2020

(54) BACKLIGHT UNIT AND DISPLAY APPARATUS INCLUDING THE SAME

(71) Applicant: SAMSUNG DISPLAY CO., LTD., Yongin-si, Gyeonggi-Do (KR)

(72) Inventors: Hee-Kwang Song, Suwon-si (KR); Hyuk-Hwan Kim, Hwaseong-si (KR); Sanghyuck Yoon, Seoul (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/245,768

(22) Filed: Jan. 11, 2019

(65) Prior Publication Data

US 2019/0221724 A1 Jul. 18, 2019

(30) Foreign Application Priority Data

Jan. 12, 2018 (KR) ........................ 10-2018-0004503

(51) Int. Cl.
*H01L 33/50* (2010.01)
*F21V 8/00* (2006.01)
(Continued)

(52) U.S. Cl.
CPC ............ *H01L 33/504* (2013.01); *C09K 11/70* (2013.01); *G02B 6/005* (2013.01); *G02B 6/0051* (2013.01);
(Continued)

(58) Field of Classification Search
CPC ..... H01L 33/504; H01L 33/507; G02B 6/005; G02B 6/0051; G02B 6/0053; G02B 6/0055; G02B 6/0229; G02F 1/1336; C09K 11/70
See application file for complete search history.

(56) References Cited

U.S. PATENT DOCUMENTS

| 7,582,906 B2 | 9/2009 | Kurihara |
| 7,661,841 B2 | 2/2010 | Kurihara et al. |

(Continued)

FOREIGN PATENT DOCUMENTS

| JP | 2017068248 | 4/2017 |
| KR | 1020070031814 | 3/2007 |

(Continued)

OTHER PUBLICATIONS

Extended European Search Report dated June 6, 2019 for Application Serial No. 19150661.7.

*Primary Examiner* — Thomas M Sember
(74) *Attorney, Agent, or Firm* — F. Chau & Associates, LLC

(57) ABSTRACT

A display apparatus includes a light source generating blue light. A display panel is configured to display an image. A light guide member is disposed below the display panel. A first light conversion layer is disposed between the light guide member and the display panel. The first light conversion layer includes a plurality of quantum dots. A low refractive layer is disposed between the light guide member and the first light conversion layer. The low refractive layer has a refractive index that is less than that of the light guide member. A second light conversion layer is disposed between the light source and the first light conversion layer and includes a plurality of fluoride-based or nitride-based phosphors. The first light conversion layer is configured to convert the blue light into green light, and the second light conversion layer is configured to convert the blue light into red light.

19 Claims, 18 Drawing Sheets

(51) Int. Cl.
   *G02F 1/13357* (2006.01)
   *C09K 11/70* (2006.01)
   *G02B 6/02* (2006.01)
   *G02F 1/1335* (2006.01)

(52) U.S. Cl.
   CPC ......... *G02B 6/0053* (2013.01); *G02B 6/0055* (2013.01); *G02B 6/0229* (2013.01); *G02F 1/1336* (2013.01); *H01L 33/507* (2013.01); *G02B 6/0043* (2013.01); *G02F 2001/133614* (2013.01); *G02F 2202/36* (2013.01)

(56) References Cited

U.S. PATENT DOCUMENTS

| | | |
|---|---|---|
| 9,274,264 B2 | 3/2016 | Fan |
| 9,417,375 B2 | 8/2016 | Lee et al. |
| 9,435,933 B2 | 9/2016 | Fan et al. |
| 2009/0034230 A1 | 2/2009 | Lim et al. |
| 2015/0369968 A1 | 12/2015 | Hsu et al. |
| 2016/0003998 A1 | 1/2016 | Benoit et al. |
| 2017/0125650 A1 | 5/2017 | Pickett et al. |

FOREIGN PATENT DOCUMENTS

| | | |
|---|---|---|
| KR | 1020070092677 | 9/2007 |
| KR | 10-1557797 | 9/2015 |
| KR | 1020160015147 | 2/2016 |

BACKLIGHT UNIT AND DISPLAY APPARATUS INCLUDING THE SAME

CROSS-REFERENCE TO RELATED APPLICATIONS

This U.S. non-provisional patent application claims priority under 35 U.S.C. § 119 of Korean Patent Application No. 10-2018-0004503, filed on Jan. 12, 2018, the entire contents of which are hereby incorporated by reference.

TECHNICAL FIELD

The application relates to a display, and more particularly, to a backlight unit and a display apparatus including the backlight unit.

DISCUSSION OF THE RELATED ART

A display apparatus, such as a liquid crystal display, may be well suited for integration into various devices on account of its low power consumption, reasonable portability, and high display quality. The display apparatus may include a thin-film transistor for each pixel to adjust on/off of a voltage for each pixel.

As display apparatuses such as liquid crystal displays might not produce their own light, the display apparatus may include a display panel and a backlight unit providing light to the display panel. The backlight unit may include a light source, for generating light, and a light guide plate, for evenly distributing the generated light to the display panel.

SUMMARY

A display apparatus includes a light source configured to generate blue light. A display panel is configured to display an image. A light guide member is disposed below the display panel. A first light conversion layer is disposed between the light guide member and the display panel. The first light conversion layer includes a plurality of quantum dots. A low refractive layer is disposed between the light guide member and the first light conversion layer. The low refractive layer has a refractive index that is less than that of the light guide member. A second light conversion layer is disposed between the light source and the first light conversion layer and includes a plurality of fluoride-based or nitride-based phosphors. The first light conversion layer is configured to convert the blue light into green light, and the second light conversion layer is configured to convert the blue light into red light.

A display apparatus includes a display panel configured to display an image. A light guide member is disposed below the display panel. The light guide member includes a light incident surface defined on at least one side surface thereof. A light source is disposed adjacent to the light incident surface. The light source is configured to generate blue light. A first light conversion layer is disposed between the light guide member and the display panel. The first light conversion layer includes a plurality of quantum dots. A low refractive layer is disposed between the light guide member and the first light conversion layer. The low refractive layer has a refractive index less than that of the light guide member. A first protective layer is disposed between the first light conversion layer and the display panel. The first protective layer covers the first light conversion layer. A second light conversion layer is disposed between the light source and the light incident surface of the light guide member. The second light conversion layer includes a plurality of fluoride-based or nitride-based phosphors. The first light conversion layer is configured to convert the blue light into green light, and the second light conversion layer is configured to convert the blue light into red light.

A backlight unit includes a light guide member including a light incident surface defined on at least one side surface thereof. A light source is disposed adjacent to the light incident surface. The light source is configured to generate blue light. A first light conversion layer is disposed on the light guide member. The first light conversion layer includes a plurality of quantum dots. A low refractive layer is disposed between the first light conversion layer and the light guide member. The low refractive layer has a refractive index less than that of each of the first light conversion layer and the light guide member. A second light conversion layer is disposed between the first light conversion layer and the light source. The second light conversion layer includes a plurality of KSF phosphors ($K_2SiF_6:Mn^{4+}$). The first light conversion layer is configured to convert the blue light into green light, and the second light conversion layer is configured to convert the blue light into red light.

BRIEF DESCRIPTION OF THE FIGURES

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE DRAWINGS

Figure 1:
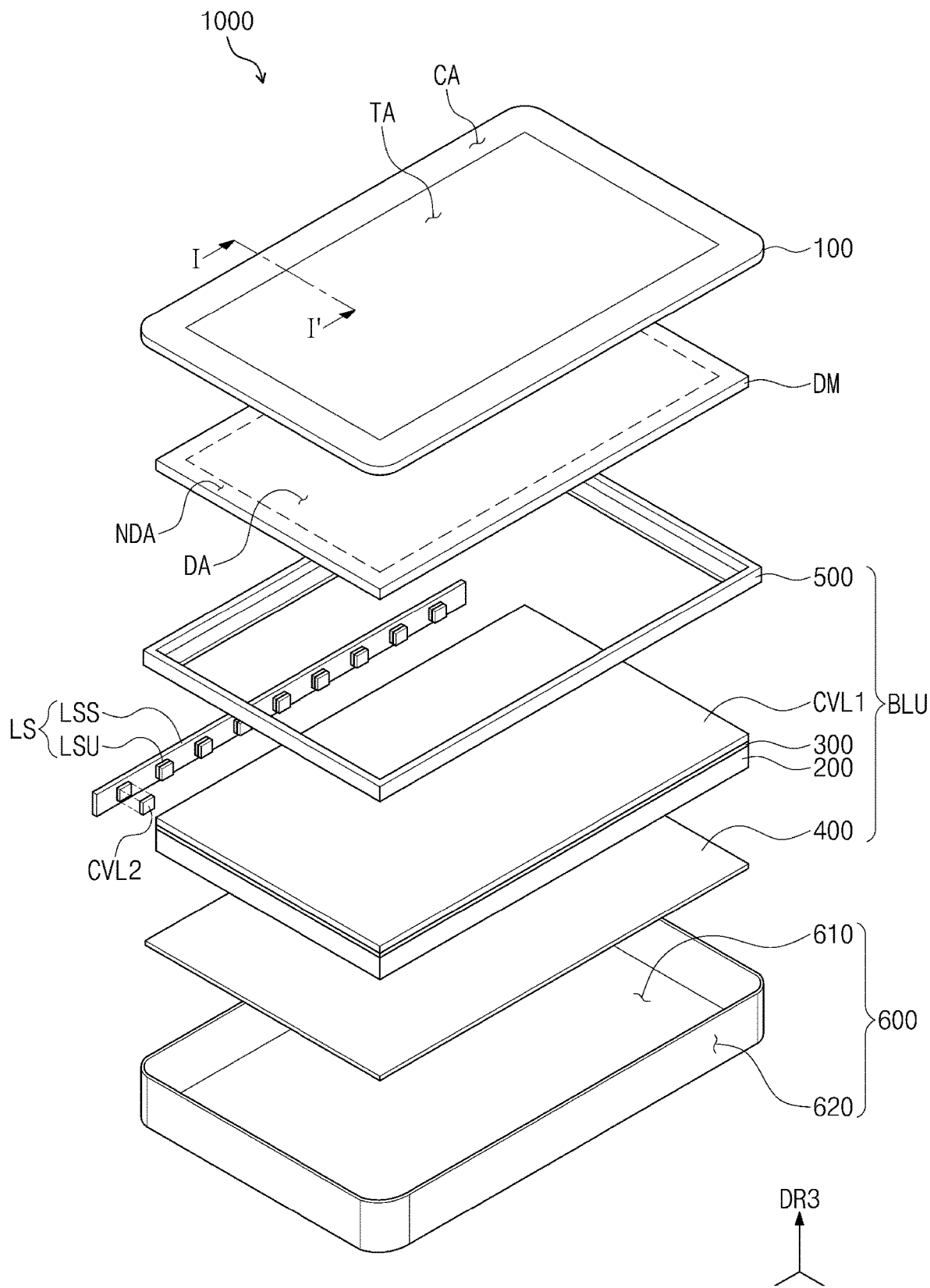
FIG. 1 is a perspective view illustrating a display apparatus according to an exemplary embodiment of the present inventive concept.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner. Like reference numerals may refer to like elements throughout the specification and the drawings.

It will also be understood that when a layer is referred to as being "on" another layer or substrate, it can be directly on the other layer or substrate, or intervening layers may also be present.

Spatially relative terms, such as "below", "beneath", "lower", "above", "upper" and the like, may be used herein for ease of description to describe one element or feature's relationship to another element(s) or feature(s) as illustrated in the figures. The spatially relative terms should be understood as terms which include different directions of configurative elements in addition to directions illustrated in the figures when using or operating the inventive concept.

It will be understood that although the terms of first and second are used herein to describe various elements and/or sections, these elements and/or sections should not be limited by these terms. These terms are only used to distinguish one element, component, or section from another element, component, or section. Accordingly, a first element, a first component, or a first section that will be described below may be a second element, a second component, or a second section within the technical idea of the present disclosure.

Hereinafter, exemplary embodiments of the inventive concept will be described below in more detail with reference to the accompanying drawings.

Figure 2:
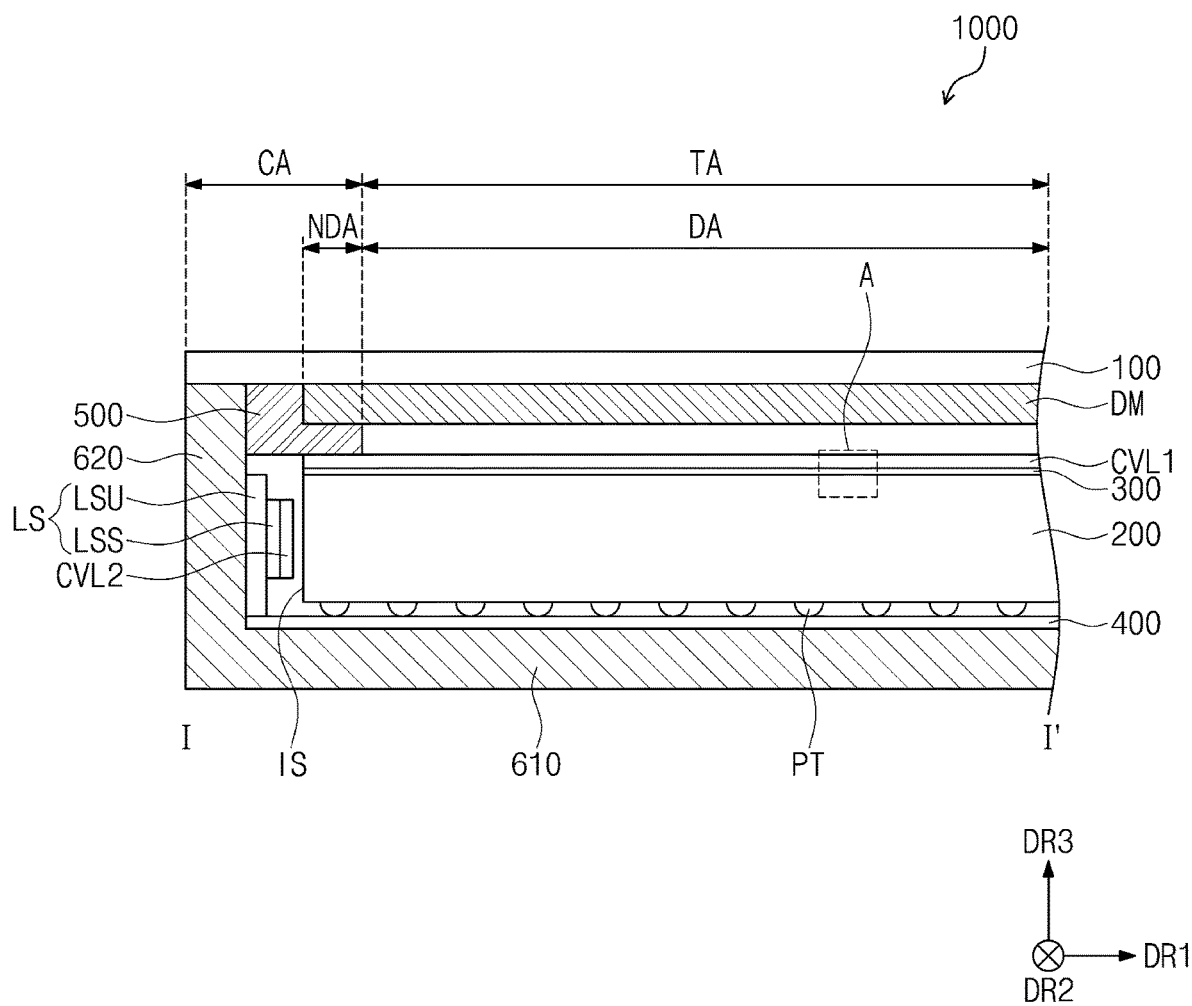
FIG. 2 is a cross-sectional view taken along line I-I' of FIG. 1.

FIG. 1 is a perspective view illustrating a display apparatus according to an exemplary embodiment of the present inventive concept, and FIG. 2 is a cross-sectional view taken along line in FIG. 1.

Referring to FIGS. 1 and 2, a display apparatus 1000, according to an exemplary embodiment of the present inventive concept, has a substantially rectangular shape having a set of shorter sides extending in a first direction DR1 and a set of longer sides extending in a second direction DR2. However, the shape of the display apparatus 1000 may be different. For example, a display apparatus, according to an exemplary embodiment of the present inventive concept, may have various shapes.

The display apparatus 1000 includes a window member 100, a display member DM, a backlight unit BLU, and an accommodation member 600.

As used herein, for convenience of description, a direction in which an image is provided in the display apparatus 1000 is defined as an upward direction, and a direction opposite to the upward direction is defined as a downward direction. As described herein, each of the upward and downward directions is parallel to a third direction DR3 that is defined as a direction perpendicular to the first and second directions DR1 and DR2. The third direction DR3 may be a reference direction for distinguishing front and rear surfaces of each of components that will be described later. However, the upward direction and the downward direction may be relative concepts, and thus may be swapped.

The window member 100 includes a light transmission part TA transmitting an image provided from the display member DM and a light shielding part CA adjacent to the light transmission part TA and through which an image is not transmitted. For example, the light shielding part CA may at least partially surround the light transmitting part TA. The light transmission part TA is disposed on a central portion of the display apparatus 1000 on a plane defined by the first direction DR1 and the second direction DR2. The light shielding part CA may have a frame shape that is disposed around the light transmission part TA to at least partially surround the light transmission part TA.

The window member 100 may include glass, sapphire, and/or plastic.

The display member DM is disposed below the window member 100. The display member DM displays an image by using light provided from the backlight unit BLU. For example, the display member DM may include a light-receiving type display panel. For example, according to an exemplary embodiment of the present inventive concept, the display member DM may be a liquid crystal display panel.

On a plane, a surface of the display member DM, on which an image is displayed, is defined as a display surface. The display surface includes a display area DA on which an image is displayed and a non-display area NDA on which an image is not displayed. The display area DA is disposed on a central portion of the display member DM on the plane to overlap the light transmission part TA of the window member 100.

The backlight unit BLU is disposed below the display member DM to provide light to the display member DM. According to an exemplary embodiment of the present disclosure, the backlight unit BLU may be an edge-type backlight unit. However, the inventive concept is not limited thereto. For example, a backlight unit BLU, according to an exemplary embodiment of the present inventive concept, may be a direct-type backlight unit.

The backlight unit BLU, according to exemplary embodiments of the present inventive concept, includes a light source LS, a light guide member 200, a low refractive layer 300, a first light conversion layer CVL1, a second light conversion layer CVL2, a reflective sheet 400, and a mold frame 500.

The light source LS is disposed adjacent to one side of the light guide plate 220 in the first direction DR1. However, the inventive concept is not limited by the position of the light source LS. For example, the light source LS may be disposed adjacent to at least one side surface of side surfaces of the light guide member 200. The one side surface of the light guide member 200, which is adjacent to the light source LS, is defined as a light incident surface IS.

The light source LS includes a plurality of light source units LSU and a light source board LSS.

Each of the light source units LSU generates light to be provided to the display member DM to provide the generated light to the light guide member 200.

According to exemplary embodiments of the present inventive concept, the light source units LSU may generate first light. The first light may have a first wavelength band. For example, the first wavelength band may be within the range of 400 nm to 500 nm, inclusive, which may include blue light.

According to exemplary embodiments of the present inventive concept, the light source units LSU may include a light emitting diode (LED) that is used as a point light source. However, the present inventive concept is not limited by the kind of the light source units LSU that may be used.

Moreover, any number of the light source units LSU may be used. According to an exemplary embodiment of the present inventive concept, the light source units LSU may be provided with one LED as a point light source instead of a plurality of LEDs or provided with a plurality of LED groups. Also, according to an exemplary embodiment of the present inventive concept, the light source units LSU may be line light source.

The light source units LSU may be mounted on the light source board LSS. The light source board LSS is disposed to face one side of the light guide member 200 in the first direction DR1 and the light source board LSS extends primarily in the second direction DR2. The light source board LSS may include a light source control unit connected to the light source units LSU. The light source control unit may be a circuit that is configured to analyze an image displayed on the display member DM to output a local dimming signal, and control brightness of light that is generated by the light source units LSU in response to the local dimming signal. In an exemplary embodiment of the present inventive concept, the light source control unit may be mounted on a separate circuit board. However, the present inventive concept is not limited by the position of the light source control unit.

The light guide member 200 may include a material having a high optical transmittance for visible light. For example, the light guide member 200 may include a glass material. In an exemplary embodiment of the present inventive concept, the light guide member 200 may include a transparent polymer resin such as polymethyl methacrylate (PMMA). In an exemplary embodiment of the present inventive concept, the light guide member 200 may have a refractive index within a range of 1.4 to 1.55, inclusive.

The light guide member 200 may include a plurality of light output patterns PT defined in a bottom surface of the light guide member 200. The light output patterns PT serve to refract light incident into the bottom surface of the light guide member 200 to change a reflection angle of the light. Although the light output patterns PT are illustrated as having an embossed shape that protrudes downwards from the bottom surface of the light guide member 200 in FIG. 2, the inventive concept is not particularly limited by the shape of the light emitting patterns PT. For example, according to an exemplary embodiment of the present inventive concept, the light emitting patterns PT may have an engraved shape that is recessed upwards from the bottom surface of the light guide member 200. Also, although each of the light emitting patterns PT is illustrated as having a semi-spherical shape in FIG. 2, the present inventive concept is not particularly limited by the shape of each of the light emitting patterns PT.

The low refractive layer 300 is disposed on a top surface of the light guide member 200. The low refractive layer 300 has a refractive index less than that of the light guide member 200. For example, the low refractive layer 300 may have a refractive index within a range of from 1.15 to 1.35, inclusive. The low refractive layer 300 provides a different refractive index at an interface between the low refractive layer 300 and the light guide member 200, so that the light provided from the light source LS to the light guide member 200 experiences total-reflection in the light guide member 200.

According to exemplary embodiments of the present inventive concept, a typical air gap provided between the first light conversion layer CVL1 and the light guide member 200 may be replaced by the low refractive layer 300. Accordingly, although the light guide member 200 and the first light conversion layer CVL1 are coupled to each other by means of the low refractive layer 300, the light provided to the light guide member 200 may be total-reflected and guided.

According to exemplary embodiments of the present inventive concept, the low refractive layer 300 may have a thickness equal to or greater than 0.5 μm. Unlike the approach described above, when the low refractive layer 300 has a thickness less than 0.5 μm, light, the light provided to the light guide member 200 might not be totally-reflected in the light guide member 200 and may be at least partially incident into the first light conversion layer CVL1. The first light conversion layer CVL1 is disposed on the low refractive layer 300. The first light conversion layer CVL1 may be applied (e.g. coated) on a top surface of the low refractive layer 300. The first light conversion layer CVL1 serves to convert a wavelength band of incident light. According to exemplary embodiments of the present inventive concept, the first light conversion layer CVL1 may include a plurality of quantum dots QD (refer to FIG. 4).

The first light conversion layer CVL1 may have a refractive index greater than that of the light guide member 200. For example, the first light conversion layer CVL1 may have a refractive index equal to or greater than 1.65.

The second light conversion layer CVL2 is disposed between the light source LS and the light incident surface IS of the light guide member 200. According to exemplary embodiments of the present inventive concept, the second light conversion layer CVL2 is provided in plurality, and the second light conversion layers CVL2 may be disposed on the light sources LSU in a one-to-one correspondence manner. However, the present inventive concept is not limited by the number of the second light conversion layers CVL2. The second light conversion layer CVL2 serves to convert a wavelength band of incident light. for example, the second light conversion layer CVL2 may include a plurality of phosphors PH (refer to FIGS. 5A and 5B). Hereinafter, the first light conversion layer CVL1 and the second conversion layer CVL2 will be described later in detail with reference to FIGS. 4, 5A, and 5B.

The reflective sheet 400 is disposed below the light guide member 200. The reflective sheet 400 reflects light emitted downwards from the light guide member 200 in an upward direction. The reflective sheet 400 includes a light reflecting material. For example, the reflective sheet 400 may include aluminum or silver.

The backlight unit BLU may further include an optical member disposed between the first light conversion layer CVL1 and the display member DM. Light provided to the optical member from the first light conversion layer CVL1 may be diffused and collected by the optical member and then provided to the display member DM. The optical member may include a plurality of sheets. For example, the optical member may include a diffusion sheet, a prism sheet, and a protective sheet. The diffusion sheet may diffuse the light provided from the first light conversion layer CVL1. The prism sheet may be disposed on the diffusion sheet to direct the light diffused by the diffusion sheet in an upward direction perpendicular to a plane.

The protective sheet may protect prisms of the prism sheet from external friction. However, the present inventive concept is not limited by the kind and number of the sheets included in the optical member.

The mold frame 500 is disposed between the first light conversion layer CVL1 and the display member DM. Where the display apparatus 1000 includes the above-described optical member, the mold frame 500 may be disposed between the first light conversion layer CVL1 and the optical member.

According to an exemplary embodiment of the present inventive concept, the mold frame has a frame shape. For example, the mold frame 500 may be disposed in correspondence to an edge of a top surface of the first light conversion layer CVL1. The display member DM may be seated on the mold frame 500. The mold frame 500 serves to fix the display member DM and the backlight unit BLU within the display apparatus 1000.

The accommodation member 600 is disposed at a bottommost end of the display apparatus 1000 to accommodate the backlight unit BLU. The accommodation member 600 includes a bottom part 610 and a plurality of sidewall parts 620 connected to the bottom part 610. In an exemplary embodiment of the present inventive concept, the light source LS may be disposed on an inside surface of the sidewall parts 620 of the accommodation member 600. The accommodation member 600 may include a metal material having rigidity.

Figure 3:
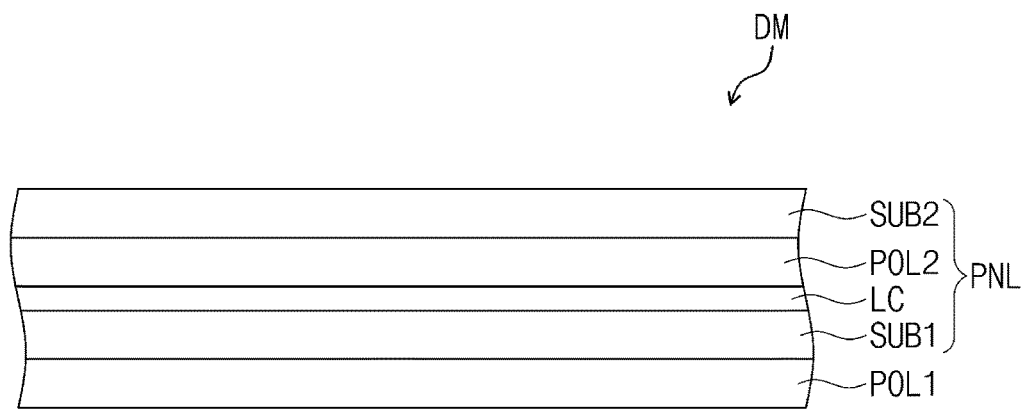
FIG. 3 is a cross-sectional view illustrating a display member in FIG. 2.

FIG. 3 is a cross-sectional view illustrating the display member in FIG. 2.

Referring to FIG. 3, the display member DM includes a first polarizing layer POL1 and a display panel PNL. The first polarizing layer POL1 is disposed between the display panel PNL and the backlight unit BLU. The first polarizing layer POL1 is configured to polarize a component of light provided from the backlight unit BLU. The first polarizing layer POL1 may have a transmission axis of a predetermined direction.

The display panel PNL is disposed on the first polarizing layer POL1 to display an image through the display area DA. The display panel PNL may be a light-receiving type display panel. For example, according to an exemplary embodiment of the present inventive concept, the display panel PNL may be a liquid crystal display panel.

The display panel PNL includes a first substrate SUB1, a second polarizing layer POL2, a second substrate SUB2, and a liquid crystal layer LC.

The first substrate SUB1 is disposed on the first polarizing layer POL1. The first substrate SUB1 may be transparent in order to easily transmit light provided from the backlight unit BLU. For example, the first substrate SUB1 may be a transparent substrate, a transparent plastic substrate, or a transparent film.

At least one pixel area and a non-pixel area adjacent to the pixel area are defined in the first substrate SUB1 on the plane. According to an exemplary embodiment of the present inventive concept, the pixel area may be provided in plurality, and the non-pixel area may be defined between the pixel areas.

Pixels may be disposed on the pixel areas of the first substrate SUB1, respectively. Each of the pixels may include a plurality of pixel electrodes and a plurality of thin-film transistors that are electrically connected to the pixel electrodes in a one-to-one corresponding manner. The thin-film transistors may be connected to the pixel electrodes, respectively, to switch a driving signal provided to each of the pixel electrodes.

The second substrate SUB2 is disposed above the first substrate SUB1 to face the first substrate SUB1. The liquid crystal layer LC may be disposed between the second substrate SUB2 and the first substrate SUB1. The liquid crystal layer LC includes a plurality of liquid crystal molecules that are oriented in a predetermined direction.

The second substrate SUB2 may include a common electrode forming an electric field for controlling the orientation of the liquid crystal molecules LCM together with the pixel electrodes. The display member DM drives the liquid crystal layer LC to display an image in the third direction DR3 that is an upward direction.

The display member DM may include a driving chip for providing a driving signal, a tape carrier package on which the driving chip is mounted, and a printed circuit board that is electrically connected to the display panel PNL through the tape carrier package.

The second polarizing layer POL2 is disposed between the liquid crystal layer LC and the second substrate SUB2. However, the present inventive concept is not limited by the position of the second polarizing layer POL2. For example, the second polarizing layer POL2 may be disposed above the second substrate SUB2.

The second polarizing layer POL2 may be a wire grid polarizer. The second polarizing layer POL2 may include a plurality of nano-wires, which are made of a metallic material. However, the present inventive concept is not limited by the specific shape and material of the second polarizing layer POL2.

The second polarizing layer POL2 may have an absorption axis having a predetermined direction. When a display mode of the display apparatus 1000 is in a bright state, the second polarizing layer POL2 transmits light, and when the display mode of the display apparatus 1000 is in a shade state, the second polarizing layer POL2 absorbs light.

Accordingly, an angle formed between the transmission axis of the first polarizing layer POL1 and the absorption axis of the second polarizing layer POL2 may be set according to the orientation mode of the liquid crystal molecules. For example, the transmission axis of the first polarizing layer POL1 may be perpendicular to the absorption axis of the second polarizing layer POL2 on the plane.

Figure 4:
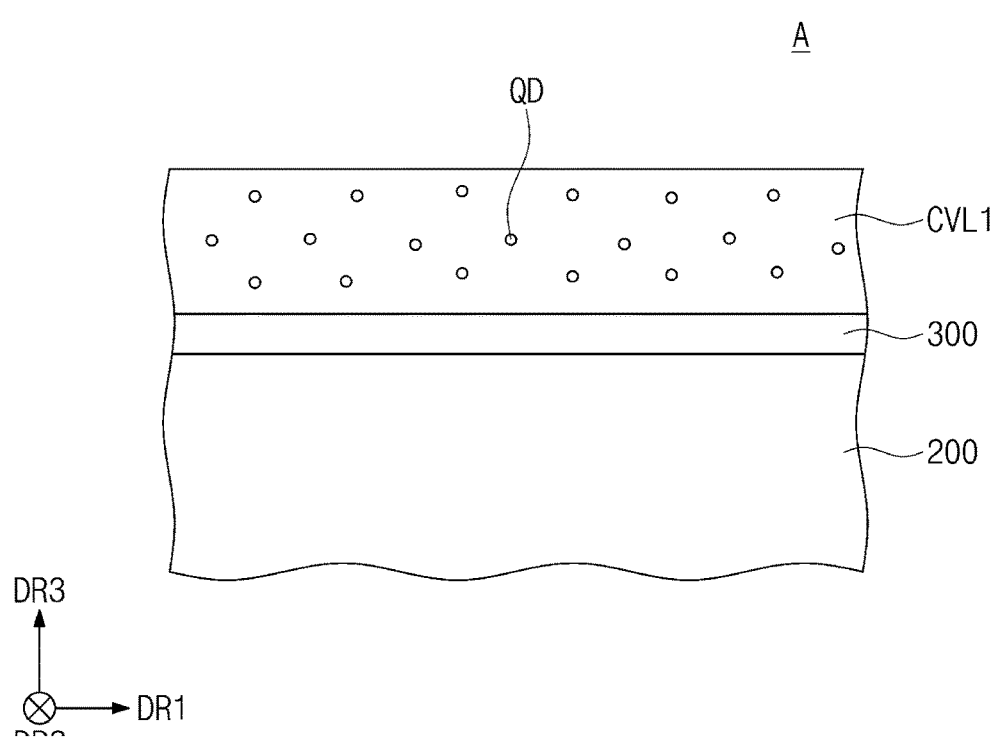
FIG. 4 is an enlarged view illustrating a region A in FIG. 2.

FIG. 4 is an enlarged view illustrating a region A in FIG. 2;

Referring to FIG. 4, the first light conversion layer CVL1 includes a plurality of quantum dots QD. Each of the quantum dots QD absorbs at least a portion of incident light to emit light having a specific color or directly transmit the absorbed light.

When the light incident into the first light conversion layer CVL1 has sufficient energy for exciting the quantum dots QD, the quantum dots QD adsorb at least a portion of the incident light and are converted into an excitation state, and then discharge light having a specific color while relaxing from the excitation state. Alternatively, when the incident light does not have sufficient energy for exciting the quantum dots QD, the incident light may directly pass through the first light conversion layer CVL1 and be seen from the outside. The light emitted from the quantum dots QD of the first light conversion layer CVL1 may be emitted in various directions.

According to exemplary embodiments of the present inventive concept, each of the quantum dots QD may adsorb first light and convert the absorbed first light into second light having a second wavelength band. The second wavelength band has a center wavelength greater than that of the first wavelength band. For example, the second wavelength band may be within a range of 480 nm to 560 nm, inclusive. For example, each of the quantum dots QD may substantially convert blue light into green light. Accordingly, each of the quantum dots QD may have a diameter that is within a range of 5 nm to 7 nm, inclusive.

Figure 5A:
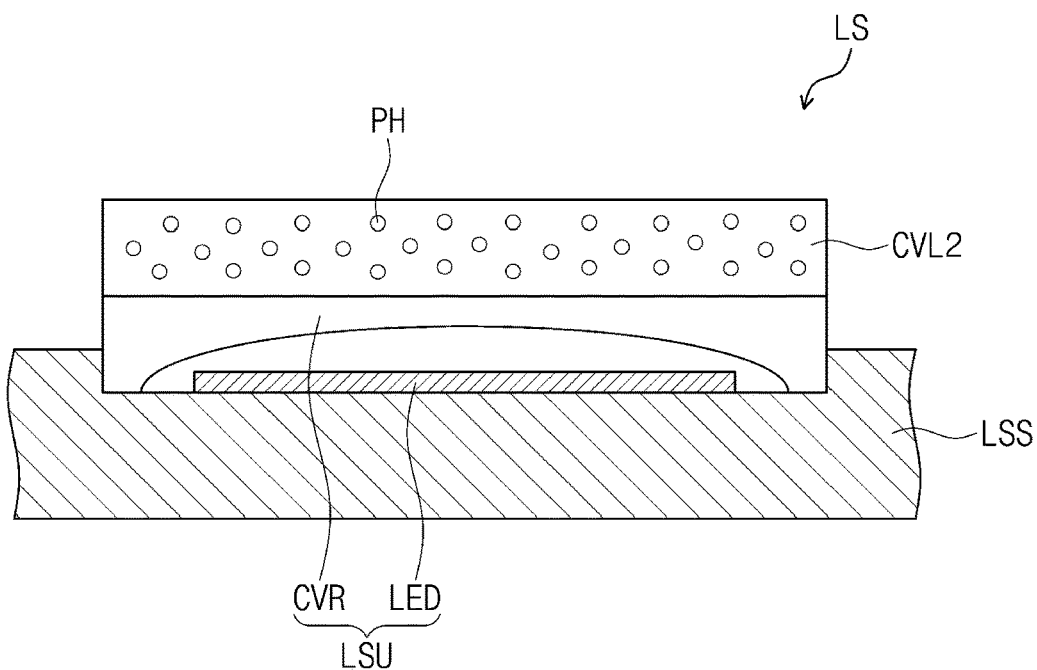
FIGS. 5A and 5B are enlarged cross-sectional views illustrating a light source and a second light conversion layer according to an exemplary embodiment of the present inventive concept.
Figure 5B:
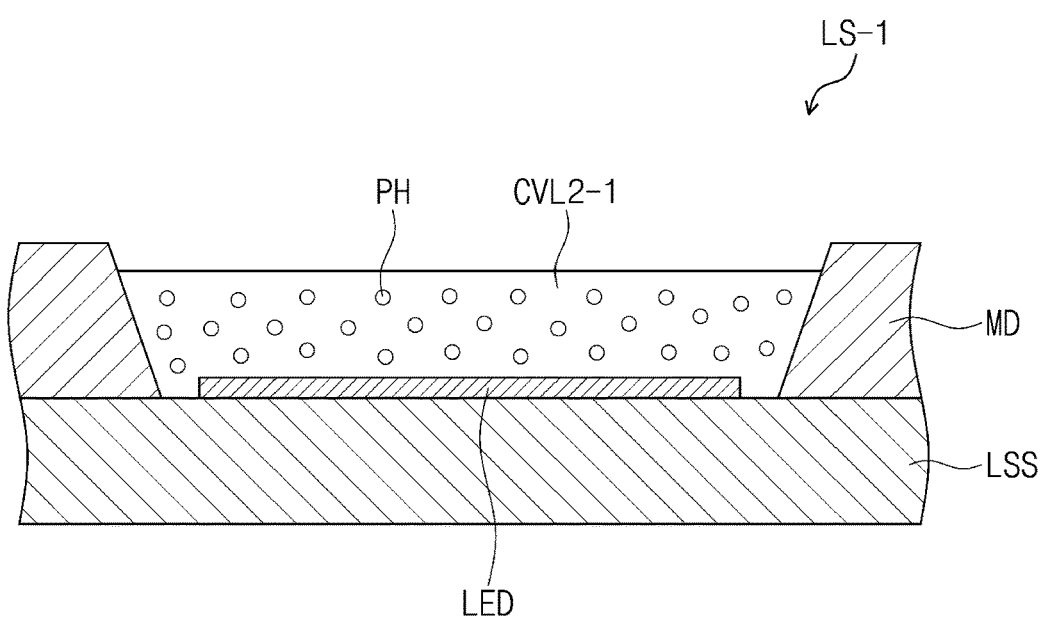

FIGS. 5A and 5B are enlarged cross-sectional views illustrating the light source and the second light conversion layer according to an exemplary embodiment of the present inventive concept.

Referring to FIG. 5A, the light source unit LSU is mounted on the light source substrate LSS. The light source unit LSU includes a light emitting diode LED and a cover substrate CVR covering the light emitting diode LED. The cover substrate CVR covers the light emitting diode LED and separates the light emitting diode LED from the second light conversion layer CVL2. The cover substrate CVR may include a flexible material.

The second light conversion layer CVL2 is disposed on the light source unit LSU. For example, the second light conversion layer CVL2 is disposed on the cover substrate. CVR. According to exemplary embodiments of the present disclosure, the second light conversion layer CVL2 may have a surface area equal to or greater than that of the light emitting diode LED on a plane defined by the second direction DR2 and the third direction DR3. In this case, light generated from the light emitting diode LED may maximize an amount of light incident into the second light conversion layer CVL2.

The second light conversion layer CVL2 includes a plurality of phosphors PH. For example, the phosphors PH may be distributed in a binder member that includes a polymer. Each of the phosphors PH may adsorb the first light and convert the absorbed first light into third light having a third wavelength band. The third wavelength band has a center wavelength greater than that of each of the first wavelength band and the second wavelength band. For example, the third wavelength band may be within a range of 640 nm to 780 nm, inclusive. For example, each of the phosphors PH may substantially convert blue light into red light. Accordingly, the phosphors PH may include a KSF phosphor ($K_2SiF_6:Mn^{4+}$) that is a fluoride compound or a nitride-based phosphor.

When the light incident into the second light conversion layer CVL2 has sufficient energy for exciting the phosphors PH, the phosphors PH adsorb at least a portion of the incident light and are converted into an excitation state, and then discharge light having a specific color while relaxing from the excitation state. Alternatively, when the incident light does not have sufficient energy for exciting the phosphors PH, the incident light may directly pass through the second light conversion layer CVL2 and be incident into the light guide member 200. The light incident into the light guide member 200 is guided by the light guide member 200 and the low refractive layer 300, and then incident in to the first light conversion layer CVL1.

Although the structure of the light source unit LSU including the cover substrate CVR covering the light emitting diode LED is illustrated in FIG. 5A, the present inventive concept is not limited by the structure of the light source unit LSU. According to an exemplary embodiment of the inventive concept, the cover substrate CVR may be omitted. For example, as illustrated in FIG. 5B, a light source LS-1 according to an exemplary embodiment of the inventive concept may further include a mold MD defining an area on which the light emitting diode LED is mounted. The mold MD is disposed on the light source substrate LSS. The light emitting diode LED may be disposed on an area in which the mold MD is not provided.

A second light conversion layer CVL2-1 covers the light emitting diode LED on the area defined by the mold MD. The light emitting diode LED may be encapsulated by the second light conversion layer CVL2-1. For example, the second light conversion layer CVL2-1 may directly contact and cover a top surface and side surfaces of the light emitting diode LED.

Figure 6:
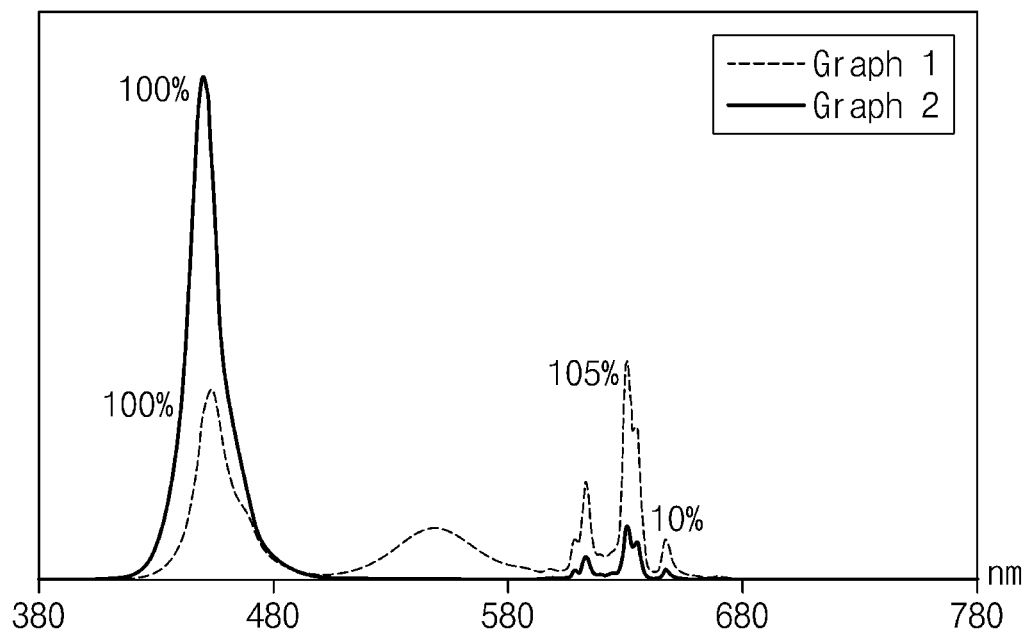
FIG. 6 is a graph illustrating a relative intensity for each wavelength of light provided to a light guide member.

FIG. 6 is a graph showing a relative intensity of light provided to the light guide member. For example, a first graph Graph 1 is a graph showing a relative intensity for each wavelength of light provided to the light guide member 200 from the light source LS of the backlight unit BLU that does not include the second light conversion layer CVL2. A second graph Graph 2 is a graph showing a relative intensity for each wavelength of light provided to the light guide member 200 from the light source LS of the backlight unit BLU that includes the second light conversion layer CVL2.

Unlike the approach described above, as illustrated in a first graph Graph 1, where a backlight unit that does not include a separated light conversion layer, a light source may generate white light. For example, light having the first wavelength band, the second wavelength band, and the third wavelength band may be provided to the light guide member 200. Here, a ratio of an intensity of a peak wavelength of third light (e.g. red light) with respect to an intensity of a peak wavelength of first light (e.g. blue light) provided to the light guide member from the light source LS may be 1.05 (refer to Graph 1).

Accordingly, as illustrated in a second graph Graph 2, the first light (e.g. blue light) and the third light (e.g. red light) that is obtained such that at least a portion of the first light (e.g. blue light) is converted by the second light conversion layer CVL2 may be provided to the light guide member 200. For example, light having the first wavelength band and the third wavelength band may be provided to the light guide member 200. Here, a ratio of an intensity of a peak wavelength of the third light (e.g. red light) transmitted through the second light conversion layer CVL2 with respect to an intensity of a peak wavelength of the first light (e.g. blue light) provided from the light source LS is 0.2 or less.

Unlike the case described above, when, on a light traveling path, the second light conversion layer CVL2 is disposed in front of the first light conversion layer CVL1 or disposed on the same layer as the same, for example, when the quantum dots QD emitting the second light (e.g. green light) are disposed in front of the phosphors PH emitting the third light (e.g. red light) or disposed on the same layer as the same, the second light (e.g. green light) emitted by each of the quantum dots may be re-incident into the phosphor. Here, the phosphor may be excited by energy of the second light (e.g. green light). Accordingly, among the light finally emitted from the backlight unit BLU, the light amount of the second light (e.g. green light) may be remarkably less than that of the third light (e.g. red light). For example, a white balance of the display apparatus 1000 reduces, and the optical efficiency may be degraded. However, according to an exemplary embodiment of the present inventive concept, since the first light conversion layer CVL1 and the second light conversion layer CVL2 are spaced apart from each other by the light guide member 200, and the phosphors PH emitting the third light (e.g. red light) are disposed in front of the quantum dots QD emitting the second light (e.g. green light), a phenomenon in which the second light (e.g. green light) is re-absorbed by the phosphors PH may be prevented. For example, the optical efficiency of the display apparatus 100 may increase, and the white balance thereof may increase.

The first light conversion layer CVL1 includes only those quantum dots QD emitting the second light (e.g. green light). For example, the conversion particles emitting the third light (e.g. red light) might not be included. Accordingly, the thickness of the first light conversion layer CVL1 may decrease. For example, the thickness of the display apparatus 1000 may decrease. For example, the first light conversion layer CVL1 may have a thickness within a range of 5 μm to 30 μm, inclusive.

Unlike the approach described above, when the thickness of the first light conversion layer CVL1 is relatively large, as the first light conversion layer CVL1 is contacted while being hardened, the light guide member 200 may be bent, or a crack may be generated in the light guide member 200. However, according to an exemplary embodiment of the present inventive concept, since the thickness of the first light conversion layer CVL1 decreases, the light guide member 200 may be prevented from being damaged.

Figure 7A:
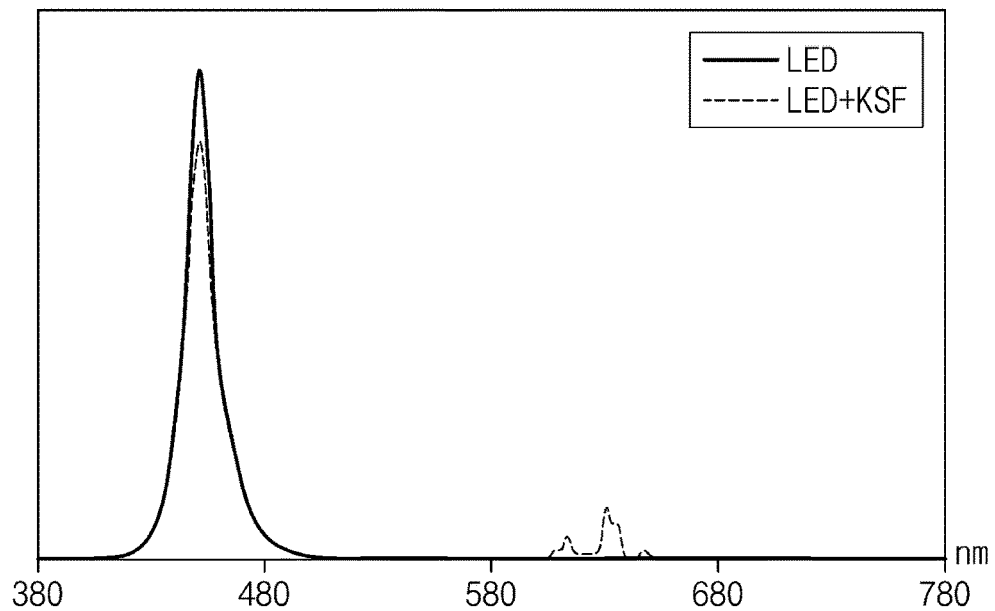
FIG. 7A is a graph showing a state in which relative intensities for each wavelength of light generated from a light source and light emitted from a second light conversion layer are compared.
Figure 7B:
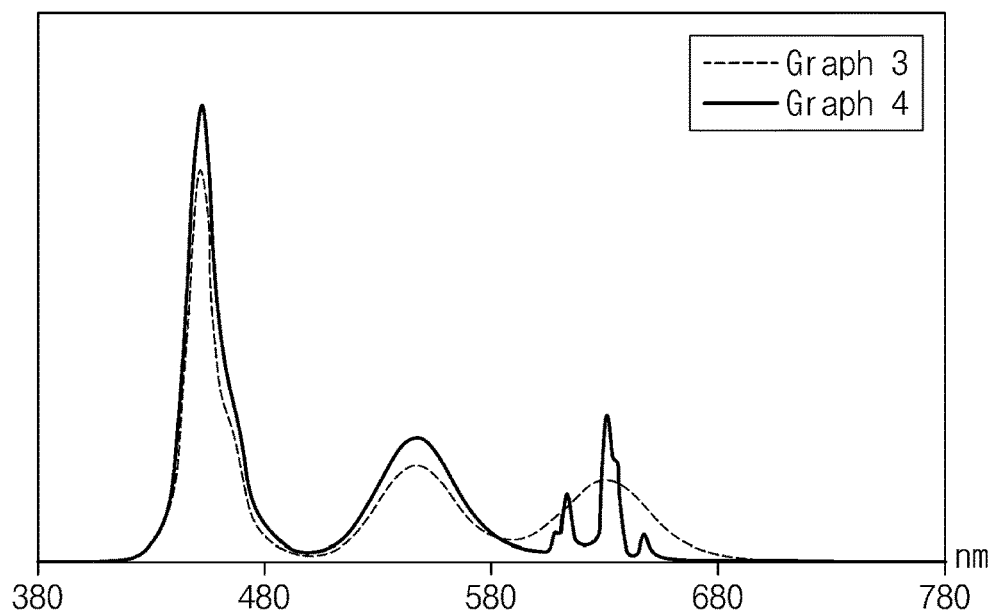
FIG. 7B is a graph showing a state in which relative intensities of light provided to a display member from a backlight unit are compared according to an exemplary embodiment of the present inventive concept.

FIG. 7A is a graph showing a state in which relative intensities for each wavelength of light generated from the light source and light emitted from the second light conversion layer are compared, and FIG. 7B is a graph showing a state in which relative intensities of light provided from the backlight unit to the display member according to an exemplary embodiment of the present inventive concept.

Unlike the approach described above, when the second light conversion layer CVL2 disposed adjacent to the light source LS includes the quantum dots emitting the third light (e.g. red light), the quantum dots may be deteriorated by the light source unit LSU. For example, a conversion rate of the third light (e.g. red light) of the second light conversion layer CVL2 may decrease.

However, according to an exemplary embodiment of the present inventive concept, since the second light conversion layer CVL2 includes the phosphors PH that are relatively more resistant to heat than the quantum dots, deterioration of the second light conversion layer CVL2 may be relieved. For example, as the conversion rate of the third light (e.g. red light) of the second light conversion layer CVL2 is prevented from being decreasing, the optical efficiency of the display apparatus 1000 may be enhanced.

As illustrated in FIG. 7A, as the first light (e.g. blue light) generated from the light source LS is incident into the second light conversion layer CVL2, a portion of the first light is converted into the third light (e.g. red light). The intensity of the first wavelength band with respect to the light transmitted through the second light conversion layer CVL2 may be less than that of the first wavelength band with respect to the light that is not transmitted through the second light conversion layer CVL2.

Referring to FIG. 7B, when the second light conversion layer CVL2 includes the quantum dots emitting the third light (e.g. red light) instead of KSF phosphors PH (refer to FIG. 5) emitting the third light (e.g. red light), the relative intensity for each wavelength of the light provided to the display member DM from the backlight unit BLU is the same as the third graph Graph 3. When the second light conversion layer CVL2 includes the KSF phosphors PH (refer to FIGS. 5A and B), the intensity for each wavelength of the light provided to the display member DM from the backlight unit BLU is the same as the fourth graph Graph 4.

According to exemplary embodiments of the present inventive concept, the intensity Graph 4 for each wavelength when the first light (e.g. blue light) provided from the light source LS is converted into the second light (e.g. green light) and the third light (e.g. red light) by the quantum dots QD and the KSF phosphors PH (refer to FIG. 5) and provided to the display member DM is greater than the intensity Graph 3 for each wavelength when the first light (e.g. blue light) provided from the light source LS is converted into the second light (e.g. green light) and the third light (e.g. red light) by the quantum dots QD emitting the second light (e.g. green light) and the quantum dots emitting the third light and provided to the display member DM.

Referring to FIGS. 7A and 7B together, although the intensity of the first light (e.g. blue light) decreases while transmitting through the second light conversion layer CVL2 including the KSF phosphors PH (refer to FIGS. 5A and B) from the light source LS, the conversion rate of each of the first light (e.g. blue light), the second light (e.g. green light), and the third light (e.g. red light), which are finally provided to the display member DM from the backlight unit BLU may be greater when the second light conversion layer CVL2 includes the KSF phosphors PH (refer to FIGS. 5A and B) than when the second light conversion layer CVL2 includes only the quantum dots. For example, when the second light conversion layer CVL2 includes the KSF phosphors PH (refer to FIGS. 5A and B), the optical efficiency of the display apparatus 1000 may be enhanced.

Figure 8:
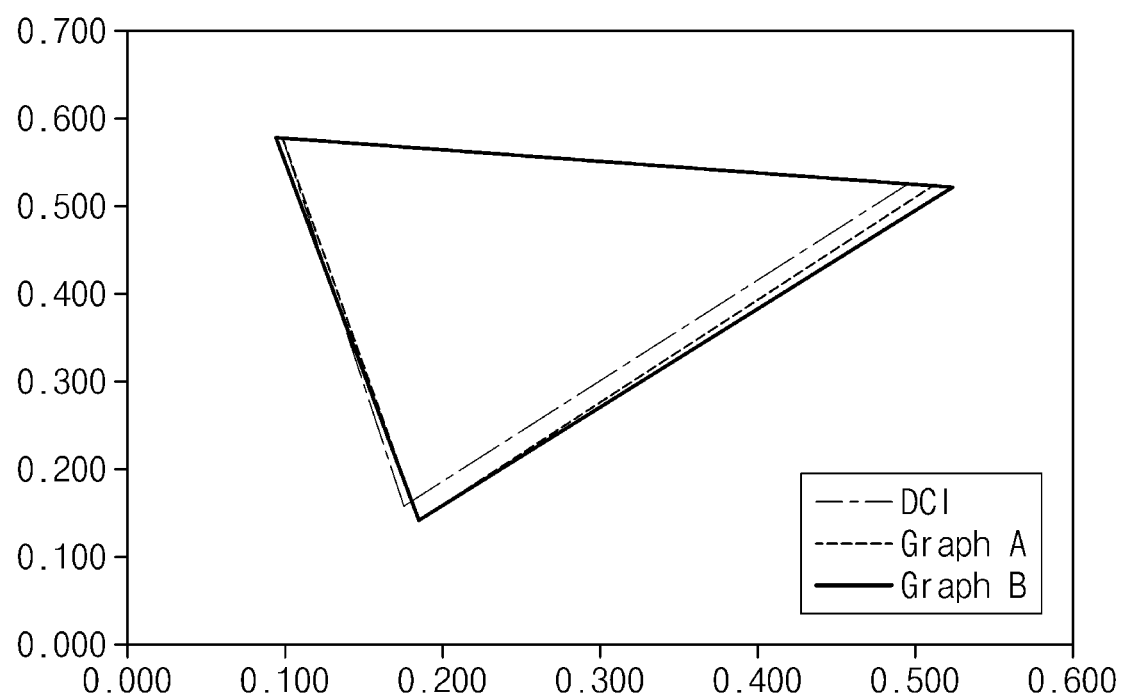
FIG. 8 is a view showing a chromaticity coordinate of light provided to a display member from a backlight unit.

FIG. 8 is a view showing a chromaticity coordinate of light provided to the display member from the backlight unit. FIG. 8 is a view exemplarily illustrating the light provided to the display member DM from the backlight unit BLU by using CIE 1976 chromaticity diagram among various chromaticity coordinates. As light has a wider area of a triangle formed by the chromaticity coordinate, the light has high color purity.

Figure 9:
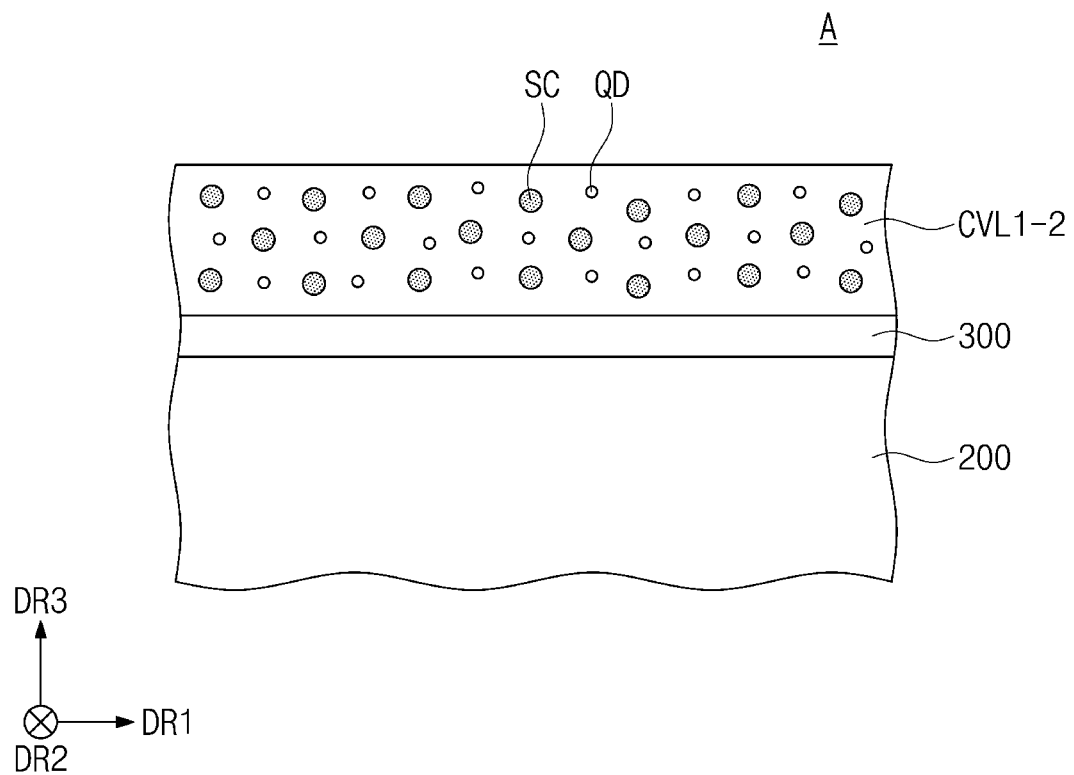
FIG. 9 is an enlarged view illustrating a region A according to an exemplary embodiment of the present inventive concept.

Referring to FIG. 8, an A graph Graph A is a chromaticity coordinate when the second light conversion layer CVL2 includes the quantum dots instead of the KSF phosphors PH (refer to FIG. 5) as conversion particles for the third light (e.g. red light), and a B graph Graph B is a chromaticity coordinate when the second light conversion layer CVL2 includes the KSF phosphors PH (refer to FIG. 5) as conversion particles for the third light (e.g. red light). All of the A graph Graph A and the B graph Graph B have a chromaticity coordinate that has a range similar to the digital cinema initiative (DCI) standard, and the A graph Graph A has an area greater than that of the B graph Graph B. For example, the color purity of the light that is finally provided to the display member DM may further increase when the second light conversion layer CVL2 includes the KSF phosphors PH (refer to FIG. 5) as the conversion particles for the third light (e.g. red light) than when the second light conversion layer CVL2 includes the quantum dots instead of the KSF phosphors PH (refer to FIG. 5) as the conversion particles for the third light (e.g. red light). FIG. 9 is an enlarged view illustrating a region A according to an exemplary embodiment of the present inventive concept.

For convenience of description, the differences between this embodiment and the foregoing embodiment will be mainly described, and omitted descriptions will be derived from the foregoing embodiment. Also, the same reference symbol is given to the same or corresponding components, and redundant descriptions with respect to the components will be omitted.

Referring to FIG. 9, a first light conversion layer CVL1-2, according to an exemplary embodiment of the present inventive concept, further includes a plurality of diffusion particles SC. The diffusion particles SC serve to scatter and diffuse light incident into the first light conversion layer CVL1-2. For example, the diffusion particles SC may be titanium oxide TiO2.

According to exemplary embodiments of the present inventive concept, each of the diffusion particles SC may have a size greater than that of each of the quantum dots QD. For example, each of the diffusion particles SC may have a diameter within a range of 150 nm to 250 nm, inclusive.

According to exemplary embodiments of the present inventive concept, the brightness of the display apparatus 1000 may increase by virtue of the diffusion particles SC.

Also, according to exemplary embodiments of the present inventive concept, the first light conversion layer CVL1-2 includes only those conversion particles QD for converting light into the second light (e.g. green light). For example, the first light conversion layer CVL1-2 does not include the conversion particles PH for converting light into the third light (e.g. red light). Accordingly, a density of the conversion particles QD and PH per unit volume of the first light conversion layer CVL1-2 may further decrease as compared to when one light conversion layer includes all of the conversion particles for converting light into the second light (e.g. green light) and the conversion particles for converting light into the third light (e.g. red light). According to an exemplary embodiment of the present inventive concept, a content rate of the quantum dot QD per unit volume of the first light conversion layer CVL1-2 may be within a range of 5% to 30%, inclusive. According to exemplary embodiments of the present inventive concept, as the density of the diffusion particles SC per unit volume of the first light conversion layer CVL1-2 increases in correspondence to the decreased density difference, the brightness uniformity of the display apparatus 1000 may further increase. For example, the content rate of the diffusion particles SC per unit volume of the first light conversion layer CVL1-2 may be equal to or greater than 1%.

Figure 10:
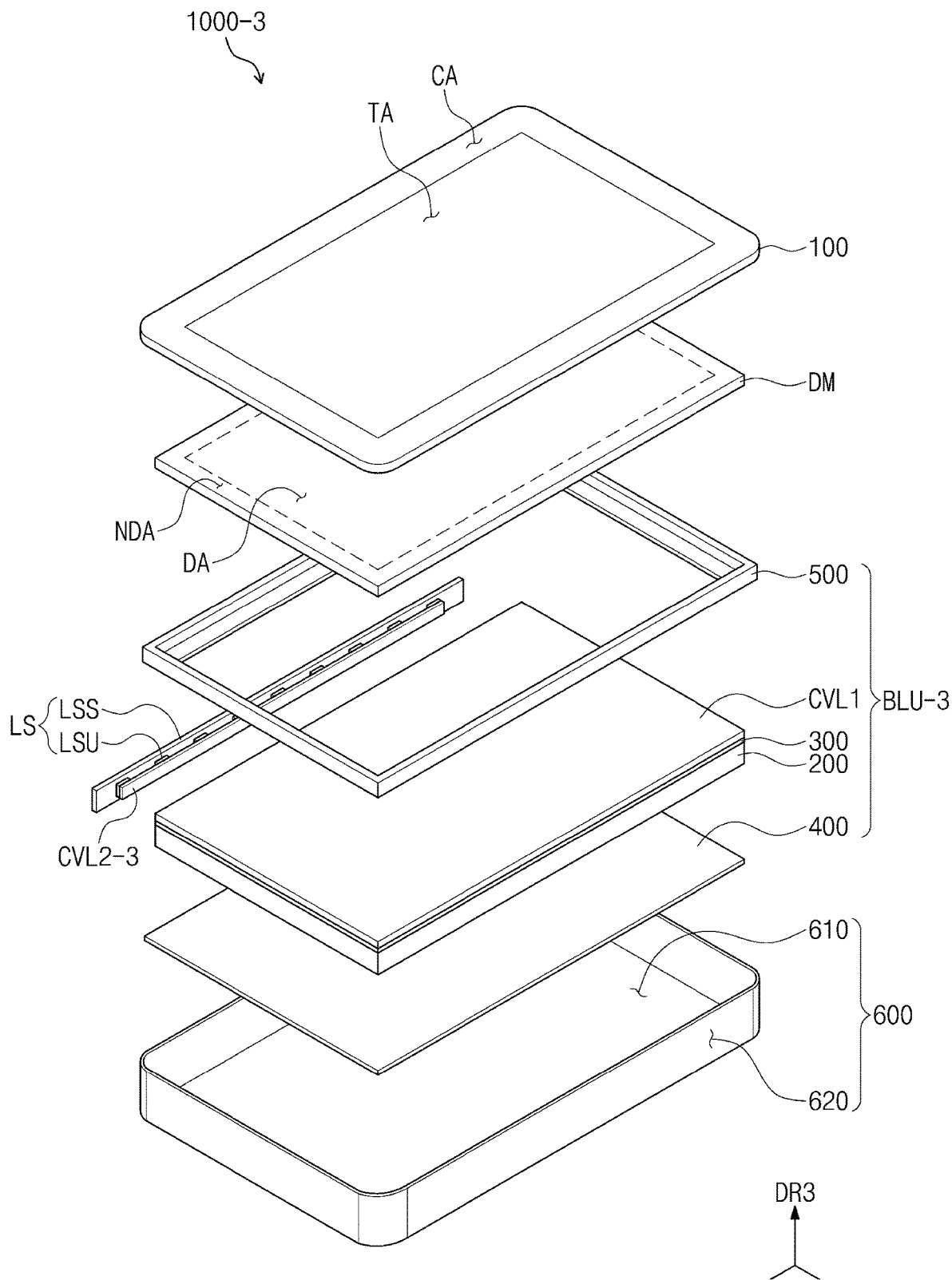
FIG. 10 is an exploded perspective view illustrating a display apparatus according to an exemplary embodiment of the present inventive concept.

FIG. 10 is an exploded perspective view illustrating a display apparatus according to an exemplary embodiment of the present inventive concept.

For convenience of description, the differences between this embodiment and the foregoing embodiment will be mainly described, and omitted descriptions will be derived from the foregoing embodiment. Also, the same reference symbol is given to the same and corresponding components, and redundant descriptions with respect to the components will be omitted.

Referring to FIG. 10, a second light conversion layer CVL2-3 of a display apparatus 1000-3, according to an exemplary embodiment of the present inventive concept, has a shape extending in the second direction DR2. The second light conversion layer CVL2-3 is disposed between the light source units LSU and the light incident surface IS of the light guide member 200 to cover the light source units LSU on a plane defined by the second direction DR2 and the third direction DR3.

Figure 11:
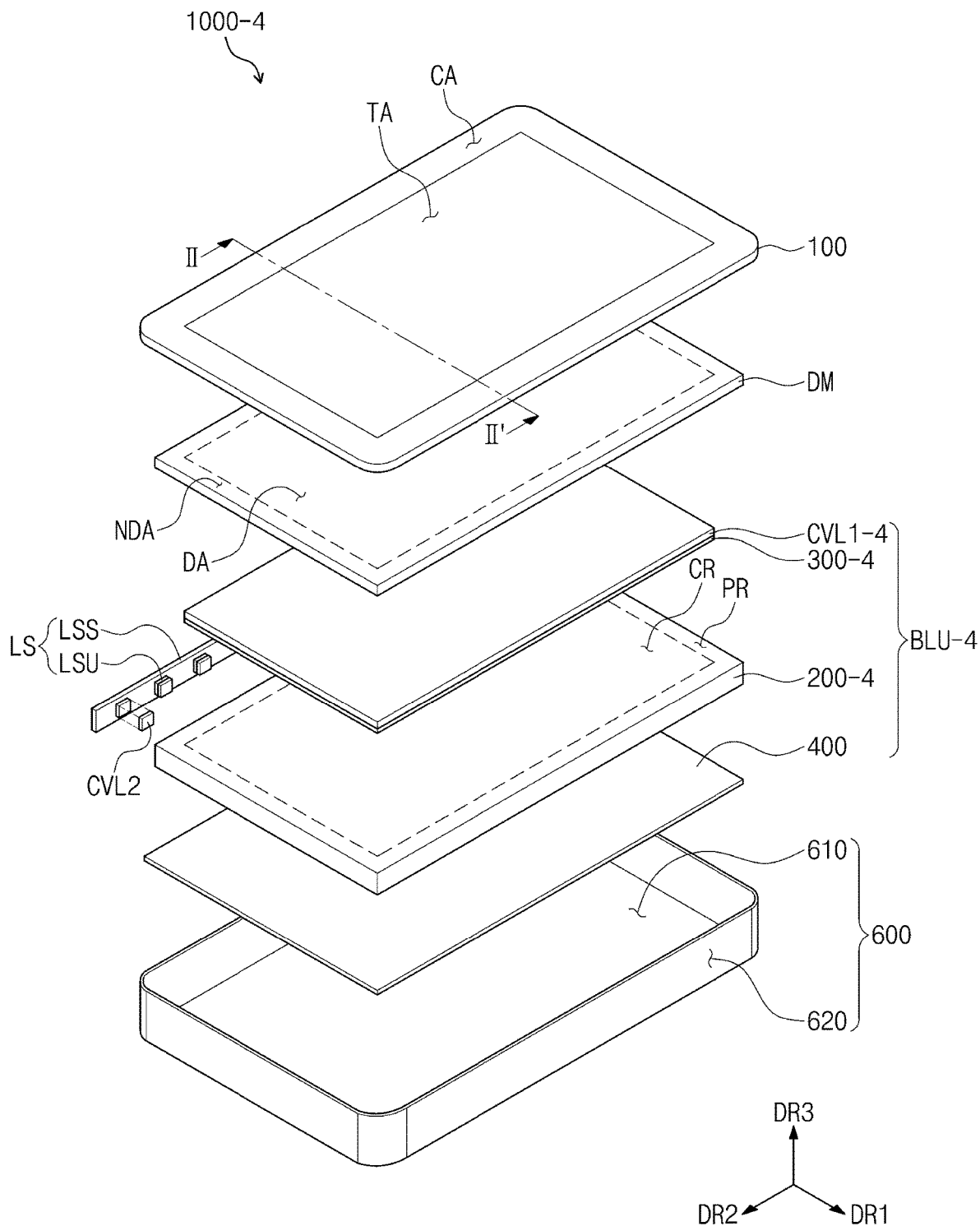
FIG. 11 is an exploded perspective view illustrating a display apparatus according to an exemplary embodiment of the present inventive concept.
Figure 12:
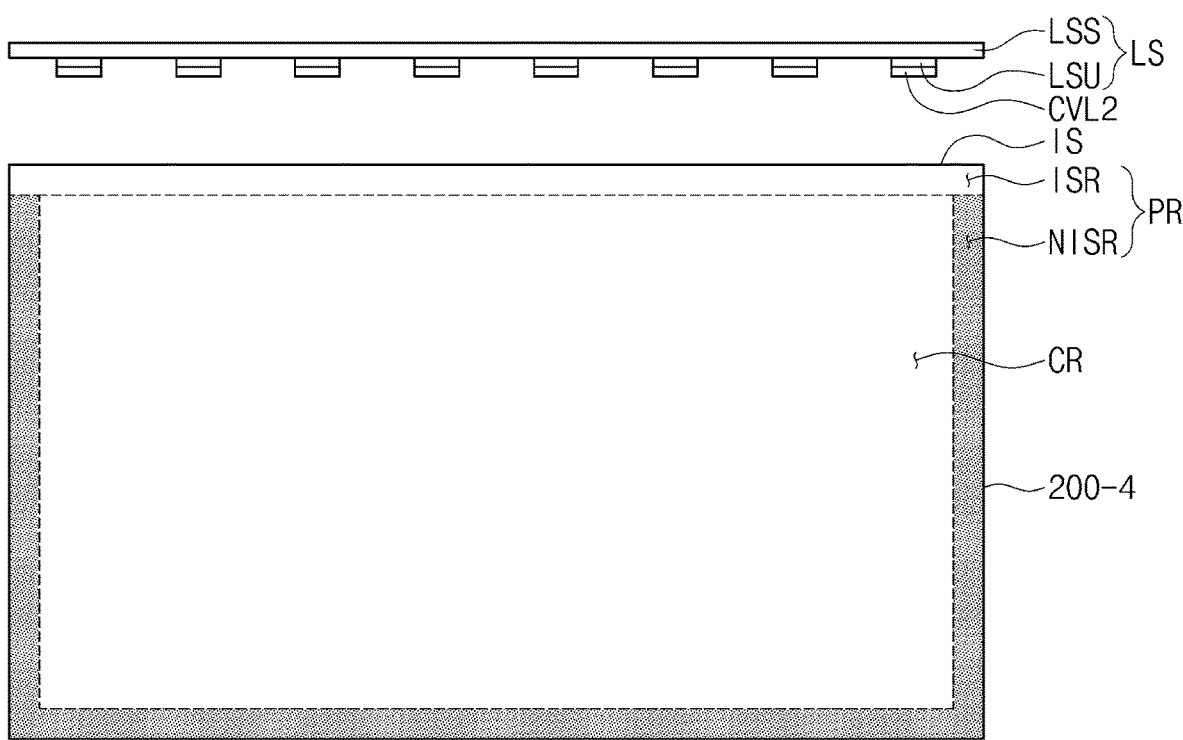
FIG. 12 is a plan view illustrating a light guide member according to an exemplary embodiment of the present inventive concept.
Figure 13:
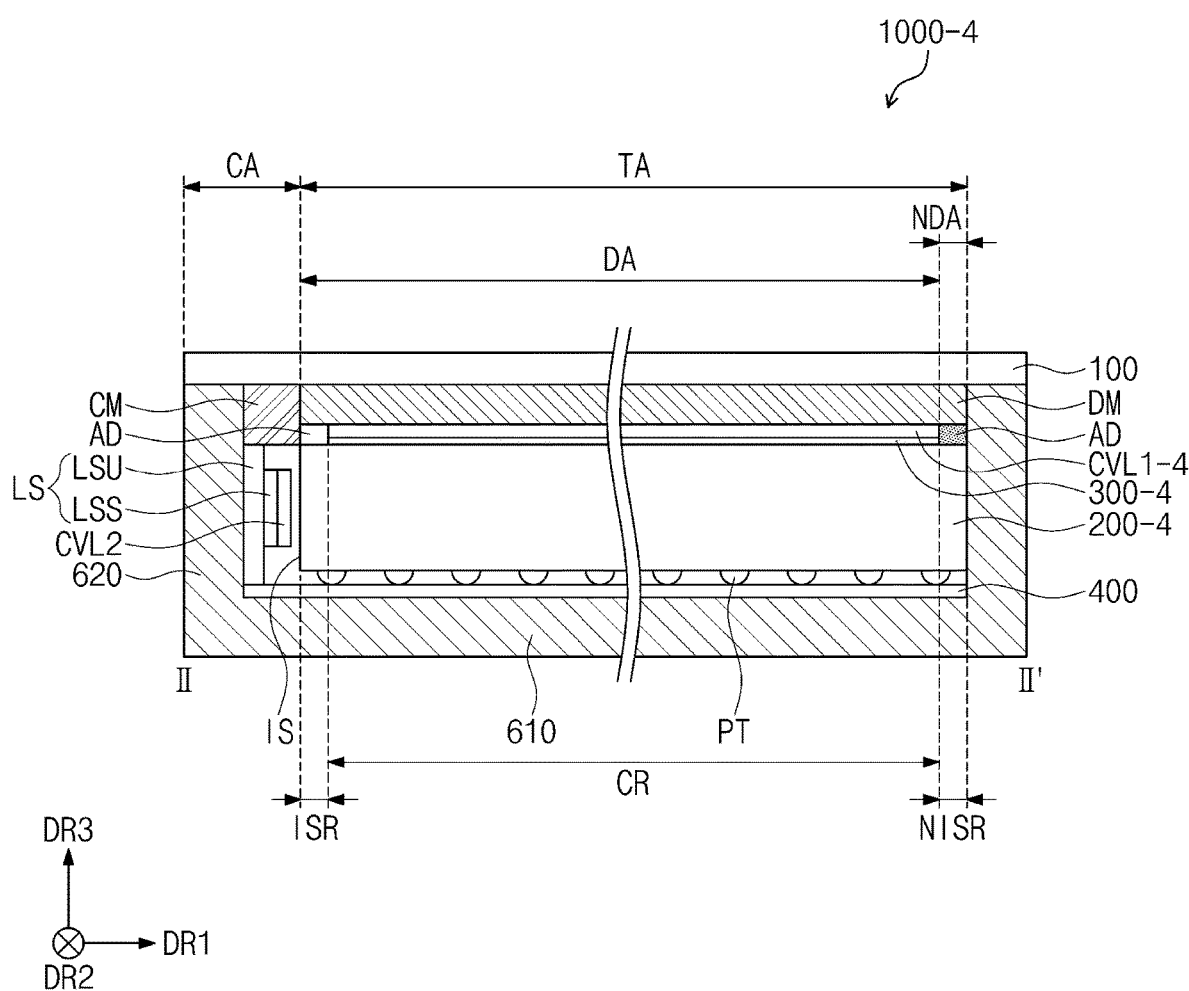
FIG. 13 is a cross-sectional view taken along line II-II' of FIG. 11.

FIG. 11 is an exploded perspective view illustrating a display apparatus according to an exemplary embodiment of the present inventive concept, and FIG. 12 is a plan view illustrating a light guide member according to an exemplary embodiment of the present inventive concept. FIG. 13 is a cross-sectional view taken along line II-II' of FIG. 11.

For convenience of description, the differences between this embodiment and the foregoing embodiment will be mainly described, and omitted descriptions will be derived from the foregoing embodiment. Also, the same reference symbol is given to the same and corresponding components, and redundant descriptions with respect to the components will be omitted.

Referring to FIGS. 11 to 13, at least a portion of a light guide member 200-4 of a display apparatus 1000-4, according to an exemplary embodiment of the present inventive concept, is coupled to the display member DM to have an integrated shape. Here, a low refractive layer 300-4 and a first light conversion layer CVL1-4 may be covered by the light guide member 200-4 and the display member DM.

For example, a central area CR and a peripheral area PR surrounding the central area are defined on a top surface of the light guide member 200-4. The peripheral area PR has a frame shape on a plane that is parallel to the top surface of the light guide member 200-4. The peripheral area PR overlaps an edge of the top surface of the light guide member 200-4.

The peripheral area PR includes a first area ISR and a second area NISR that is an area except for the first area ISR. The first area ISR is defined as an area of the peripheral area PR, which is adjacent to the light source LS. The first area ISR overlaps the light incident surface IS.

The low refractive layer 300-4 and the first light conversion layer CVL1-4 are disposed to overlap the central area CR of the light guide member 200-4. For example, a bottom surface of the low refractive layer 300-4 overlaps the top surface of the light guide member 200-4, which corresponds to the central area CR. Although the low refractive layer 300-4 and the first light conversion layer CVL1-4 are disposed only on the central area CR of the light guide member 200-4 in FIGS. 11 and 13, the present inventive concept is not limited thereto. For example, according to an exemplary embodiment of the present inventive concept, the low refractive layer 300-4 and the first light conversion layer CVL1-4 may be disposed to overlap the first area ISR as well as the central area CR.

At least a portion of the peripheral area PR of the light guide member 200-4 overlaps an edge of a bottom surface of the display member DM. For example, the peripheral area PR of the light guide member 200-4 may overlap the entire non-display area NDA of the display member DM.

A coupling member AD may be disposed on the second area NISR between the light guide member 200-4 and the display member DM. Here, the coupling member AD is not disposed on the first area ISR. Unlike the approach described above, when the coupling member AD is disposed on the first area ISR, total-reflection might not be performed in a space in the light guide member 200, which is adjacent to the light incident surface IS. For example, light leakage may occur in the first area ISR.

The light guide member 200-4 and the display member DM may be coupled to each other by the coupling member AD. The coupling member AD may include a material having an adhesion force. However, the present inventive concept is not limited thereto. For example, according to an exemplary embodiment of the present inventive concept, the coupling member AD may be omitted. In this case, the light guide member 200-4 and the display member DM may be coupled to each other through laser bonding. For example, the second area NISR of the peripheral area PR of the light guide member 200-4 may be irradiated with laser and thus attached to the display member DM.

In FIG. 13, the above-described mold frame 500 (refer to FIGS. 1 and 2) may be omitted, and a light shielding member CM may be provided. The light shielding member CM serves to prevent light provided from the light source LS from being incident into the low refractive layer 300-4, the first light conversion layer CVL1-4, and a side surface of the display member DM. However, the light shielding member CM may be omitted according to the shape of each of the backlight unit BLU and the accommodation member 600.

Figure 14:
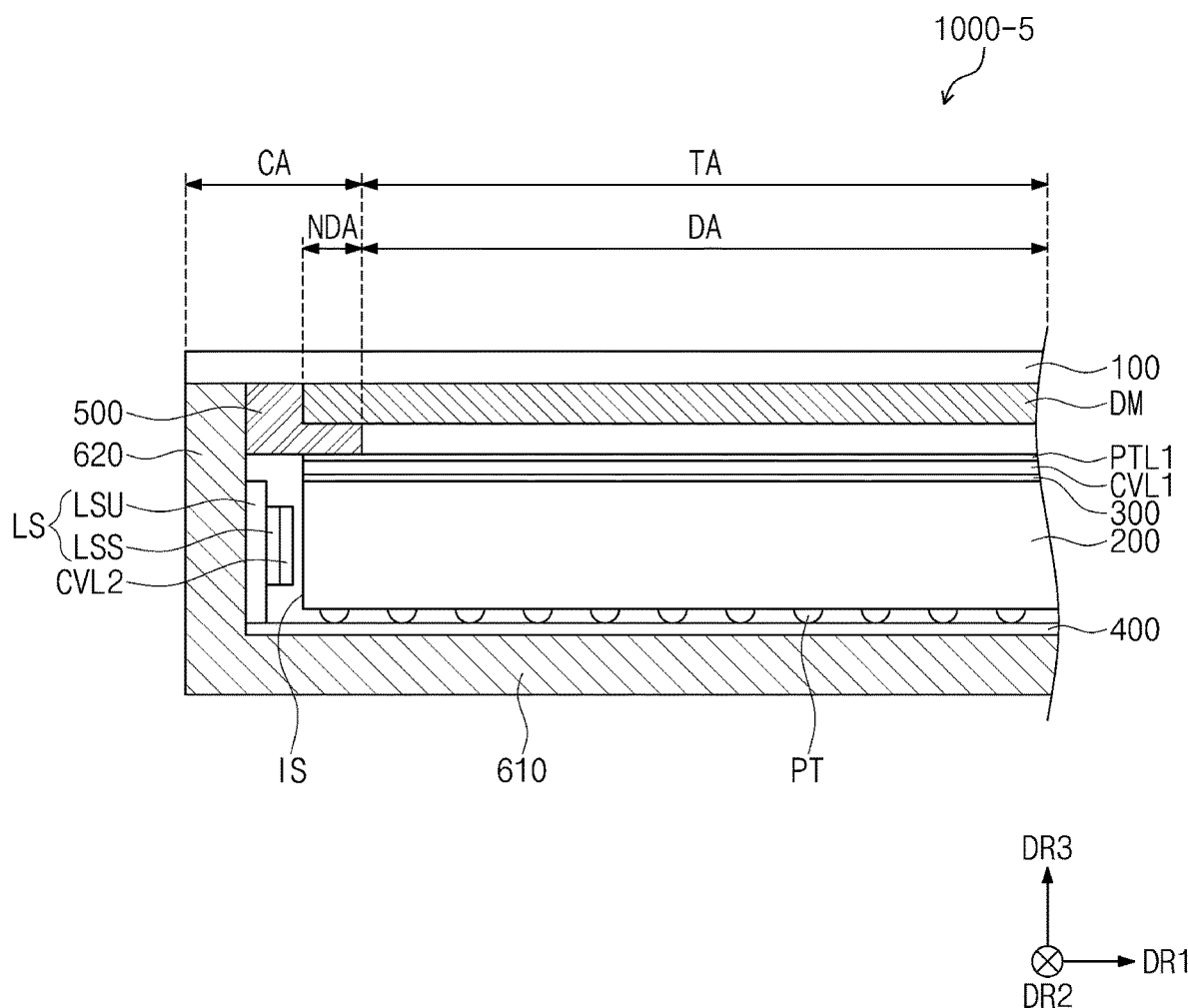
FIG. 14 is a cross-sectional view illustrating a display apparatus according to an exemplary embodiment of the present inventive concept.

FIG. 14 is a cross-sectional view illustrating a display apparatus according to an exemplary embodiment of the present inventive concept.

For convenience of description, the differences between this embodiment and the foregoing embodiment will be mainly described, and omitted descriptions will be derived from the foregoing embodiment. Also, the same reference symbol is given to the same and corresponding components, and redundant descriptions with respect to the components will be omitted.

Referring to FIG. 14, a backlight unit of a display apparatus 1000-5, according to an exemplary embodiment of the present inventive concept, further includes a first protective layer PTL1. The first protective layer PTL1 serves to prevent the quantum dots QD of the first light conversion layer CVL1 from being damaged. The first protective layer PTL1, according to exemplary embodiments of the present inventive concept, may include an inorganic film or an organic film. For example, the first protective layer PTL1 may include silicon nitride (SiNx).

Figure 15:
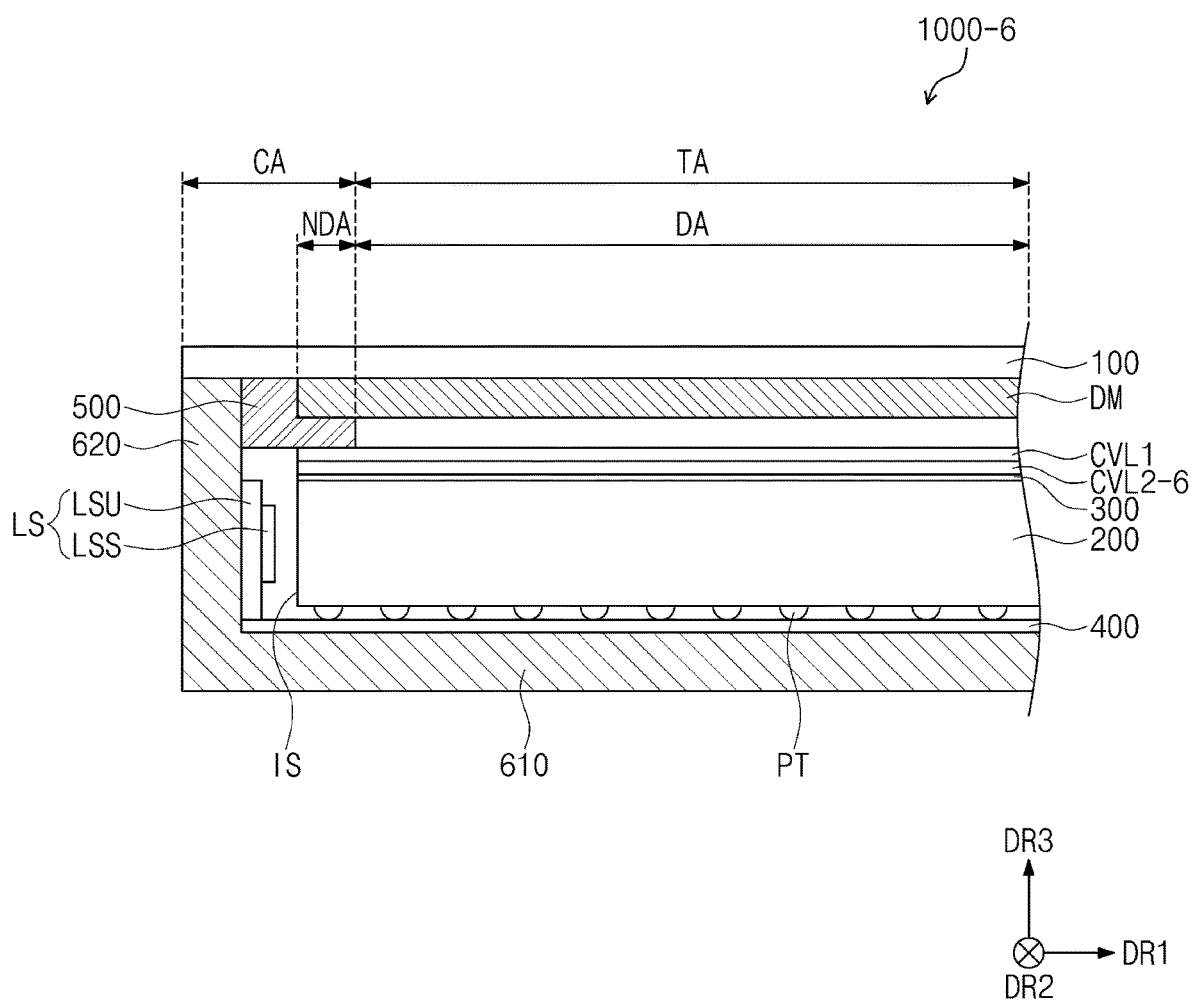
FIG. 15 is a cross-sectional view illustrating a display apparatus according to an exemplary embodiment of the present inventive concept.

FIG. 15 is a cross-sectional view illustrating a display apparatus according to an exemplary embodiment of the present inventive concept.

For convenience of description, the differences between this embodiment and the foregoing embodiment will be mainly described, and omitted descriptions will be derived from the foregoing embodiment. Also, the same reference symbol is given to the same and corresponding components, and redundant descriptions with respect to the components will be omitted.

Referring to FIG. 15, a second light conversion layer CVL2-6, according to an exemplary embodiment of the present inventive concept, may be disposed between the low refractive layer 300 and the first light conversion layer CVL1.

First light guided in the light guide member 200 passes through the low refractive layer 300 and is incident into the second light conversion layer CVL2-6. A portion of the first light incident into the second light conversion layer CVL2-6 is converted into third light by phosphors of the second light conversion layer CVL2-6. The first and third light that is not converted is incident into the first light conversion layer CVL1 from the second light conversion layer CVL2-6. A portion of the first light incident into the first light conversion layer CVL1 may be converted into second light by quantum dots of the first light conversion layer CVL1, and the first to third light may be outputted toward the display member DM.

According to exemplary embodiments of the present inventive concept, on a light traveling path, the second light conversion layer CVL2-6 emitting red light may be disposed in front of the first light conversion layer CVL1.

Figure 16:
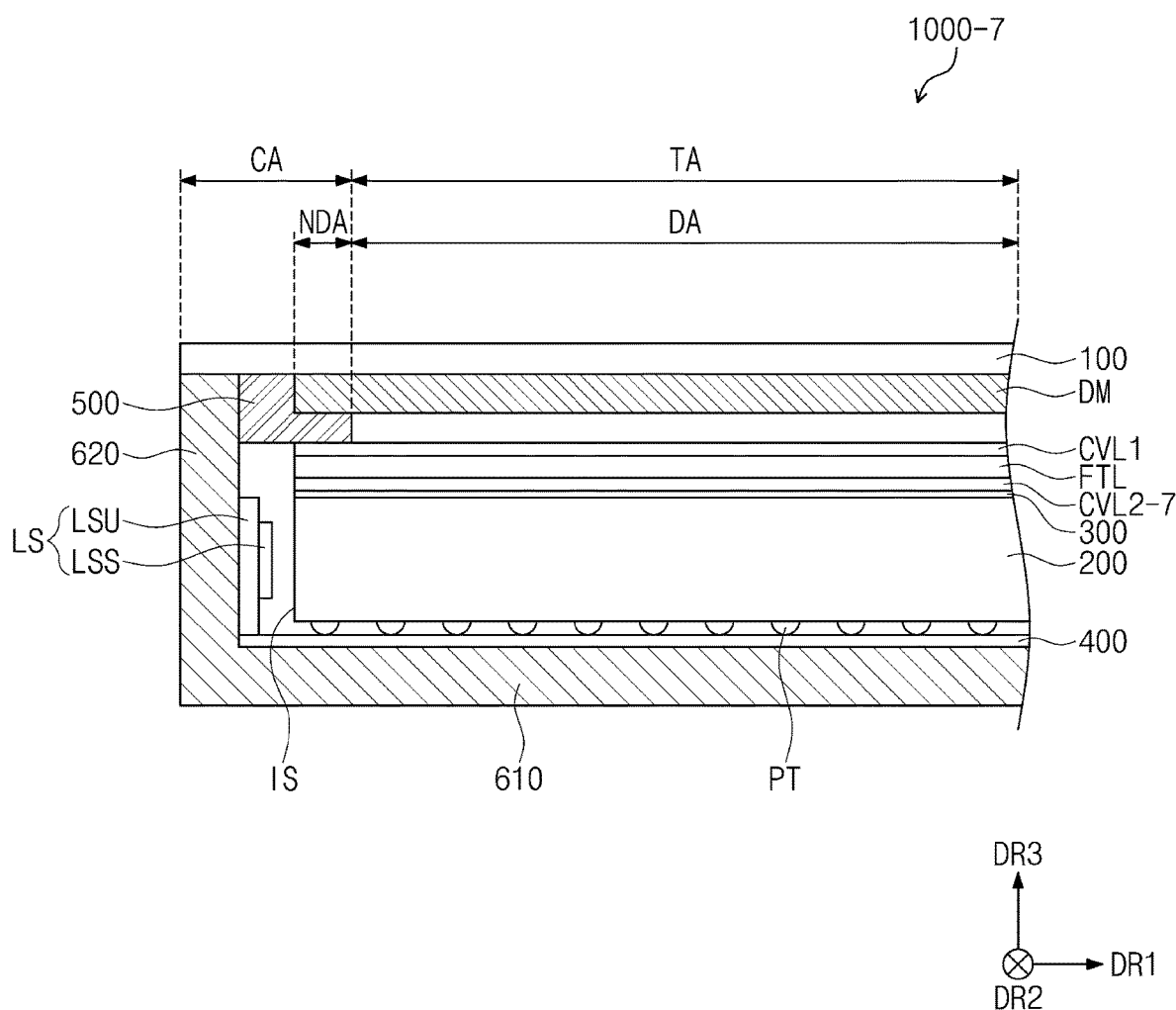
FIG. 16 is a cross-sectional view illustrating a display apparatus according to an exemplary embodiment of the present inventive concept.
Figure 17:
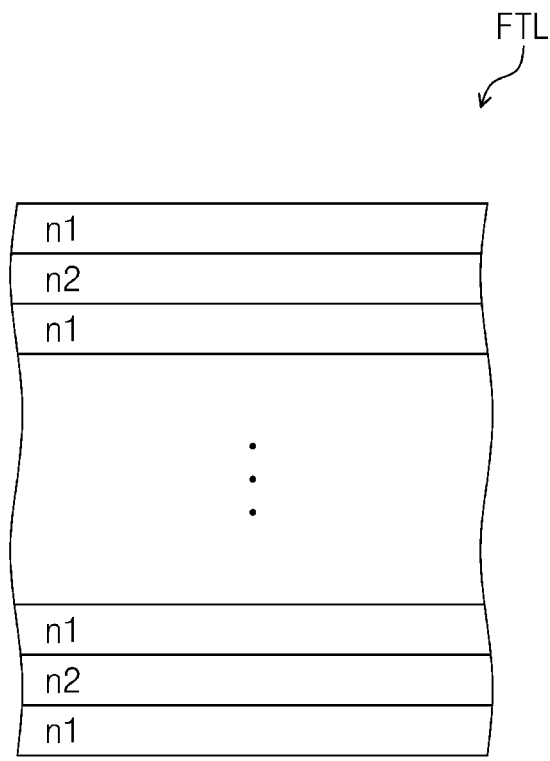
FIG. 17 is an enlarged cross-sectional view illustrating an optical filter layer in FIG. 16.
Figure 18:
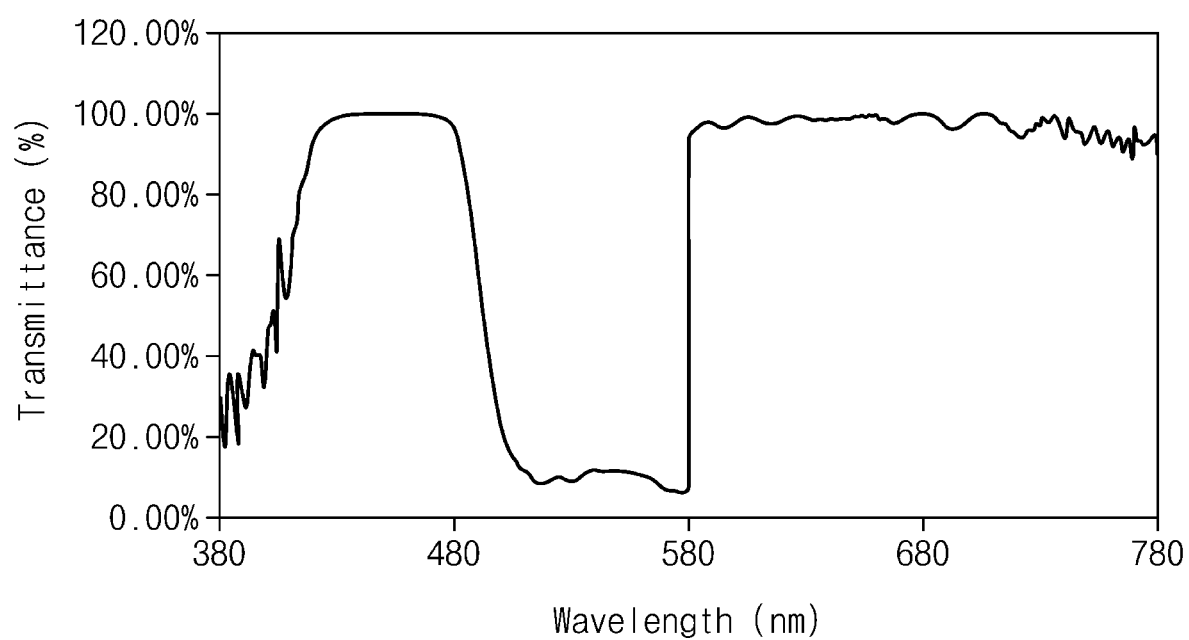
FIG. 18 is a graph illustrating a transmittance of the optical filter layer in FIG. 16.

FIG. 16 is a cross-sectional view illustrating a display apparatus according to an exemplary embodiment of the present inventive concept, and FIG. 17 is an enlarged cross-sectional view illustrating an optical filter layer in FIG. 16. FIG. 18 is a graph illustrating a transmittance of the optical filter layer in FIG. 16.

For convenience of description, the differences between this embodiment and the foregoing embodiment will be mainly described, and omitted descriptions will be derived from the foregoing embodiment. Also, the same reference symbol is given to the same and corresponding components, and redundant descriptions with respect to the components will be omitted.

Referring to FIGS. 16 and 17, a display apparatus 1000-6, according to an exemplary embodiment of the present inventive concept, includes an optical filter layer FTL. The optical filter layer FTL is disposed between a first light conversion layer CVL1 and a second light conversion layer CVL2-7.

For example, the low refractive layer 300 is disposed on the light guide member 200, the second light conversion layer CVL2-7 is disposed on the low refractive layer 300, the optical filter layer FTL is disposed on the second light conversion layer CVL2-7, and the first light conversion layer CVL1 is disposed on the optical filter layer FTL.

The optical filter layer FTL may include a plurality of insulation films. The insulation films include a first insulation film IL1 and a second insulation film IL2. Each of the first insulation film IL1 and the second insulation film IL2 may be provided in plurality and alternately laminated. The first insulation films IL1 may be disposed on uppermost and bottommost portions of the optical filter layer FTL, respectively.

The first insulation film IL1 and the second insulation film IL2 have different refractive indexes from each other. For example, the first insulation film IL1 has a first refractive index n1. According to an exemplary embodiment of the present inventive concept, the first refractive index n1 may be 2.0. For example, the first insulation film IL1 may include silicon nitrite (SiNx), titanium oxide (TiOx), tantalum oxide (TaOx), and/or zinc oxide (ZrOx).

The second insulation film IL2 has a second refractive index n2. The second refractive index n2 is less than the first refractive index n1. According to an exemplary embodiment of the present inventive concept, the second refractive index n2 may be 1.5. For example, the second insulation film IL2 may include silicon oxide (SiOx) and/or magnesium fluoride (MgF).

Each of the first insulation film IL1 and the second insulation film IL2 may have a thickness that is determined by the refractive index thereof. For example, when a center wavelength of light incident into the optical filter layer FTL is defined as $\lambda$, each of the first insulation layers IL1 has a thickness of about $\lambda/4n1$, and each of the second insulation layers IL2 has a thickness of about $\lambda/4n2$.

Accordingly, the laminated number of each of the first and second insulation layers IL1 and IL2 constituting the optical filter layer FTL may be determined according to the thickness of each of the first and second insulation layers IL1 and IL2. For example, the first insulation layers IL1 and the second insulation layers IL2 may form 20 layers or less.

Referring to FIG. 18, the optical filter layer FTL, according to exemplary embodiments of the present inventive concept, may reflect the second light (e.g. green light) and transmit the first light (e.g. blue light) and the third light (e.g. red light). Accordingly, although the second light (e.g. green light) emitted from the first light conversion layer CVL1 travels downwards and is emitted towards the second light conversion layer CVL2-7, the second light (e.g. green light) may be reflected upwards by the optical filter layer FTL between the first light conversion layer CVL1 and the second light conversion layer CVL2-7. For example, a phenomenon in which the second light (e.g. green light) converted by the first light conversion layer CVL1 is re-incident into the second light conversion layer CVL2-7 may be further effectively prevented.

Although the second light conversion layer CVL2-7 is disposed above the light guide member 200, and the optical filter layer FTL is disposed between the first light conversion layer CVL1 and the second light conversion layer CVL2-7 in FIG. 16, the present inventive concept is not limited thereto. According to an exemplary embodiment of the present inventive concept, the optical filter layer FTL may be disposed between the low refractive layer 300 and the first light conversion layer CVL1 even when the second light conversion layer CVL2-7 is disposed adjacent to the light incident surface IS instead of being disposed above the light guide member 200. In this case, a phenomenon in which the second light (e.g. green light) that is converted by the first light conversion layer CVL1 travels downwards may be prevented, and thus the optical efficiency may increase.

Figure 19:
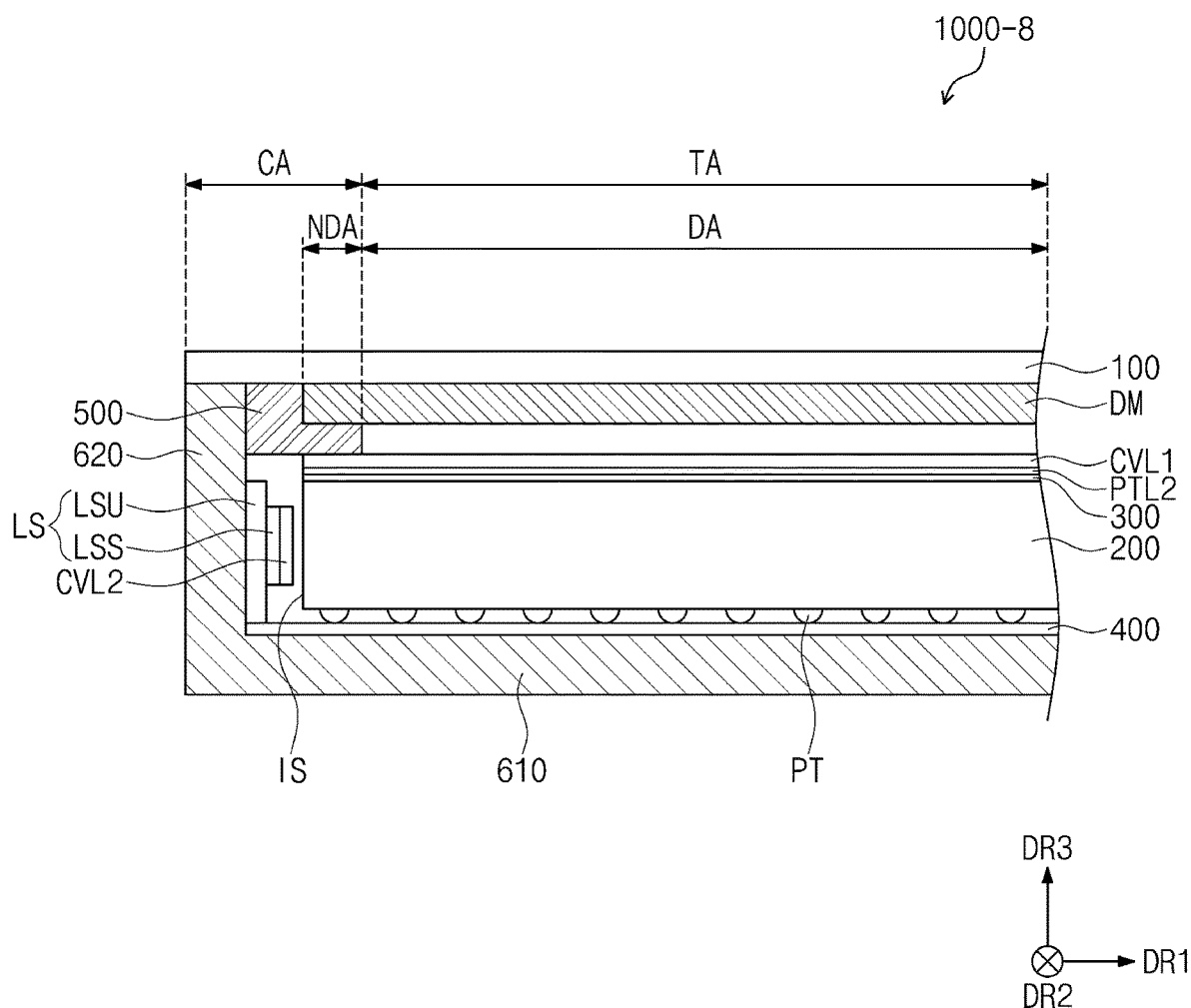
FIG. 19 is a cross-sectional view illustrating a display apparatus according to an exemplary embodiment of the present inventive concept.

FIG. 19 is a cross-sectional view illustrating a display apparatus according to an exemplary embodiment of the present inventive concept.

For convenience of description, the differences between this embodiment and the foregoing embodiment will be mainly described, and omitted descriptions will be derived from the foregoing embodiment. Also, the same reference symbol is given to the same and corresponding components, and redundant descriptions with respect to the components will be omitted.

Referring to FIG. 19a display apparatus 1000-8, according to an exemplary embodiment of the present inventive concept, may further include a second protective layer PTL2. The second protective layer PTL2 is disposed between the low refractive layer 300 and the first light conversion layer CVL1.

The second protective layer PTL2 serves to separate the low refractive layer 300 and the first light conversion layer CVL1 from each other. For example, the second protective layer PTL2 may prevent the low refractive layer 300 from being damaged by a solvent that is contained in the first light conversion layer CVL1 in a process of applying the first light conversion layer CVL1 on the low refractive layer 300.

According to exemplary embodiments of the present inventive concept, the display quality and optical efficiency of the display apparatus may increase.

Although various exemplary embodiments of the present invention have been described herein, it is understood that the present invention should not be limited to these exemplary embodiments but various changes and modifications can be made by one ordinary skilled in the art within the spirit and scope of the present invention as hereinafter claimed.

What is claimed is:

1. A display apparatus, comprising:
a light source configured to generate blue light;
a display panel configured to display an image;
a light guide member disposed below the display panel;
a first light conversion layer disposed between the light guide member and the display panel, the first light conversion layer comprising a plurality of quantum dots;
a low refractive layer disposed between the light guide member and the first light conversion layer, the low refractive layer having a refractive index that is less than that of the light guide member;
an optical filter layer disposed between the low refractive layer and the first light conversion layer, the optical filter layer configured to reflect green light and to transmit red light and blue light; and
a second light conversion layer disposed between the light source and the first light conversion layer and comprising a plurality of KSF phosphors,
wherein the first light conversion layer is configured to convert the blue light into the green light, and
wherein the second light conversion layer is configured to convert the blue light into the red light.

2. The display apparatus of claim 1, wherein the second light conversion layer is disposed between the light source and the light guide member.

3. The display apparatus of claim 2, wherein the light source is disposed adjacent to at least one side surface of the light guide member.

4. The display apparatus of claim 1, further comprising a first protective layer disposed between the first light conversion layer and the display panel, the first protective layer covering the first light conversion layer.

5. The display apparatus of claim 1, wherein the optical filter layer comprises:
a plurality of first insulation films each of which having a first refractive index; and
a plurality of second insulation films each of which having a second refractive index that is less than the first refractive index, and
wherein the plurality of first insulation films and the plurality of second insulation films are alternately laminated.

6. The display apparatus of claim 1, wherein the first light conversion layer is coated on the low refractive layer.

7. The display apparatus of claim 1, wherein the second light conversion layer is disposed between the low refractive layer and the first light conversion layer.

8. The display apparatus of claim 7, further comprising a second protective layer disposed between the first light conversion layer and the low refractive layer and separating the first light conversion layer and the low refractive layer from each other.

9. The display apparatus of claim 1, wherein a ratio of an intensity of a peak wavelength of the red light transmitted through the second light conversion layer with respect to an intensity of a peak wavelength of the blue light provided from the light source is 0.2 or less.

10. The display apparatus of claim 1, wherein the first light conversion layer further comprises a plurality of diffusion particles configured to diffuse incident light.

11. The display apparatus of claim 1, wherein a central area and a peripheral area surrounding the central area are defined on a top surface of the light guide member, wherein the central area of the light guide member contacts a bottom surface of the low refractive layer, and
wherein at least a portion of the peripheral area of the light guide member is coupled to an edge of a bottom surface of the display panel.

12. The display apparatus of claim 11, wherein the peripheral area comprises a light incident part adjacent to the light source, and wherein the peripheral area, except for the light incident part, is coupled to the edge of the bottom surface of the display panel.

13. The display apparatus of claim 11 wherein the light guide member, the low refractive layer, the first light conversion layer, and the display panel are part of a single integral unit.

14. The display apparatus of claim 1, wherein the first light conversion layer has a thickness within a range of 5 μm to 30 μm, inclusive.

15. The display apparatus of claim 1, wherein a content of a quantum dot per unit volume of the first light conversion layer is within a range of 5% to 30%, inclusive.

16. The display apparatus of claim 1, wherein the low refractive layer has a thickness of 0.5 μm.

17. A display apparatus, comprising:
a display panel configured to display an image;
a light guide member disposed below the display panel, the light guide member comprising a light incident surface defined on at least one side surface thereof;
a light source disposed adjacent to the light incident surface, the light source configured to generate blue light;
a first light conversion layer disposed between the light guide member and the display panel, the first light conversion layer comprising a plurality of quantum dots;
a low refractive layer disposed between the light guide member and the first light conversion layer, the low refractive layer having a refractive index less than that of the light guide member;
a first protective layer disposed between the first light conversion layer and the display panel, the first protective layer covering the first light conversion layer, and
a second light conversion layer disposed between the low refractive index layer and the first light conversion layer, the second light conversion layer comprising a plurality of KSF phosphors,
wherein the first light conversion layer is configured to convert the blue light into green light,
wherein the second light conversion layer is configured to convert the blue light into red light.

18. The display apparatus of claim 17, wherein a ratio of an intensity of a peak wavelength of the red light transmitted through the second light conversion layer with respect to an intensity of a peak wavelength of the blue light provided from the light source is 0.2 or less.

19. A backlight unit, comprising:
a light guide member comprising a light incident surface defined on at least one side surface thereof;
a light source disposed adjacent to the light incident surface, the light source configured to generate blue light;
a first light conversion layer disposed on the light guide member, the first light conversion layer comprising a plurality of quantum dots;
a low refractive layer disposed between the first light conversion layer and the light guide member, the low refractive layer having a refractive index less than that of each of the first light conversion layer and the light guide member; and
a second light conversion layer disposed between the first light conversion layer and the light source, the second light conversion layer comprising a plurality of KSF phosphors ($K_2SiF_6:Mn4+$),
wherein the first light conversion layer is configured to convert the blue light into green light,
wherein the second light conversion layer is configured to convert the blue light into red light,
wherein a central area and a peripheral area surrounding the central area are defined on a top surface of the light guide member, wherein the central area of the light guide member contacts a bottom surface of the low refractive layer, and
wherein at least a portion of the peripheral area of the light guide member is coupled to an edge of a bottom surface of a display panel.

* * * * *